United States Patent
Vorbach et al.

[11] Patent Number: 6,119,181
[45] Date of Patent: Sep. 12, 2000

[54] I/O AND MEMORY BUS SYSTEM FOR DFPS AND UNITS WITH TWO- OR MULTI-DIMENSIONAL PROGRAMMABLE CELL ARCHITECTURES

[75] Inventors: Martin Vorbach; Robert Münch, both of Karlsruhe, Germany

[73] Assignee: PACT GmbH, Munich, Germany

[21] Appl. No.: 08/947,254

[22] Filed: Oct. 8, 1997

[30] Foreign Application Priority Data

Dec. 20, 1996 [DE] Germany ............ 196 54 595

[51] Int. Cl.[7] .............. G06F 13/40; G06F 15/80
[52] U.S. Cl. ............ 710/100; 710/110; 710/129; 712/11
[58] Field of Search ............... 395/280, 309, 395/800.11, 80.25, 800.29, 377; 326/38, 39, 41; 364/489; 370/419; 710/100, 129, 110; 712/11, 14, 18, 25, 29, 31; 711/100

[56] References Cited

U.S. PATENT DOCUMENTS

| | | | |
|---|---|---|---|
| Re. 34,363 | 8/1993 | Freeman | 326/38 |
| 4,706,216 | 11/1987 | Carter | 365/94 |
| 4,739,474 | 4/1988 | Holsztynski et al. | 395/800.14 |
| 4,761,755 | 8/1988 | Ardini et al. | 364/749 |
| 4,811,214 | 3/1989 | Nosenchuck et al. | 395/800.11 |
| 4,852,048 | 7/1989 | Morton | 712/11 |
| 4,870,302 | 9/1989 | Freeman | 326/41 |
| 4,901,268 | 2/1990 | Judd | 364/748.19 |
| 4,967,340 | 10/1990 | Dawes | 395/800.19 |
| 5,014,193 | 5/1991 | Garner et al. | 395/830 |
| 5,015,884 | 5/1991 | Agrawal et al. | 326/39 |
| 5,021,947 | 6/1991 | Campbell et al. | 395/800.25 |
| 5,023,775 | 6/1991 | Poret | 326/40 |
| 5,081,375 | 1/1992 | Pickett et al. | 326/41 |
| 5,109,503 | 4/1992 | Cruickshank et al. | 395/500 |
| 5,113,498 | 5/1992 | Evan et al. | 395/828 |

(List continued on next page.)

FOREIGN PATENT DOCUMENTS

| | | |
|---|---|---|
| 0 221 360 | 5/1987 | European Pat. Off. . |
| 0428327A1 | 5/1991 | European Pat. Off. . |
| 748 051 A2 | 12/1991 | European Pat. Off. . |
| 0539595A1 | 5/1993 | European Pat. Off. . |
| 0 678 985 | 10/1995 | European Pat. Off. . |
| 0 726 532 | 8/1996 | European Pat. Off. . |
| 735 685 | 10/1996 | European Pat. Off. . |
| 4416881 | 11/1994 | Germany . |
| WO90/11648 | 10/1990 | WIPO . |
| 94/08399 | 4/1994 | WIPO . |

OTHER PUBLICATIONS

Villasenor, John, et al., "Configurable Computing." *Scientific American*, vol. 276, No. 6, Jun. 1997, pp. 66–71.

Villasenor, John, et al., "Configurable Computing Solutions for Automatic Target Recognition," *IEEE*, 1996 pp. 70–79.

Tau Edward, et al., "A First Generation DPGA Implementation," *FPD'95*, pp. 138–143.

Athanas, Peter, et al. "IEEE Symposium of FPGAs For Custom Computing Machines," *IEEE Computer Society Press*, Apr. 19–21, 1995, pp. i–vii, 1–222.

Bittner, Ray, A., Jr., "Wormhole Run–Time Reconfiguration: Conceptualization and VLSI Design of a High Performance Computing system," *Dissertation*, Jan. 23, 1997, pp. i–xx, 1–415.

(List continued on next page.)

*Primary Examiner*—Gopal C. Ray
*Attorney, Agent, or Firm*—Kenyon & Kenyon

[57] ABSTRACT

A uniform bus system is provided which operates without any special consideration by a programmer. Memories and peripheral may be connected to this bus system without any special measures. Likewise, units may be cascaded with the help of the bus system. The bus system combines a number of internal lines, and leads them as a bundle to terminals. The bus system control is predefined and does not require any influence by the programmer. Any number of memories, peripherals or other units can be connected to the bus system.

35 Claims, 12 Drawing Sheets

U.S. PATENT DOCUMENTS

| | | | |
|---|---|---|---|
| 5,123,109 | 6/1992 | Hillis | 395/800.22 |
| 5,125,801 | 6/1992 | Nabity et al. | 417/44.1 |
| 5,128,559 | 7/1992 | Steele | 326/38 |
| 5,142,469 | 8/1992 | Weisenborn | 364/146 |
| 5,204,935 | 4/1993 | Mihara et al. | 706/4 |
| 5,208,491 | 5/1993 | Ebeling et al. | 326/41 |
| 5,226,122 | 7/1993 | Thayer et al. | 395/500 |
| 5,233,539 | 8/1993 | Agrawal et al. | 364/489 |
| 5,247,689 | 9/1993 | Ewert | 395/311 |
| 5,287,472 | 2/1994 | Horst | 365/189.08 |
| 5,301,344 | 4/1994 | Kolchinsky | 395/800.32 |
| 5,303,172 | 4/1994 | Magar et al. | 364/726.04 |
| 5,336,950 | 8/1994 | Popli et al. | 326/39 |
| 5,361,373 | 11/1994 | Gilson | 395/800.01 |
| 5,418,952 | 5/1995 | Morley et al. | 395/800.14 |
| 5,421,019 | 5/1995 | Holsztynski et al. | 395/800.14 |
| 5,422,823 | 6/1995 | Agrawal et al. | 364/489 |
| 5,426,378 | 6/1995 | Ong | 326/39 |
| 5,430,687 | 7/1995 | Hung et al. | 365/230.08 |
| 5,440,245 | 8/1995 | Galbraith et al. | 326/38 |
| 5,442,790 | 8/1995 | Nosenchuck | 395/707 |
| 5,444,394 | 8/1995 | Watson et al. | 326/45 |
| 5,448,186 | 9/1995 | Kawata | 326/41 |
| 5,455,525 | 10/1995 | Ho et al. | 326/41 |
| 5,457,644 | 10/1995 | McCollum | 364/716.01 |
| 5,473,266 | 12/1995 | Ahanin et al. | 326/41 |
| 5,473,267 | 12/1995 | Stansfield | 326/41 |
| 5,475,583 | 12/1995 | Bock et al. | 364/141 |
| 5,475,803 | 12/1995 | Stearns et al. | 345/436 |
| 5,483,620 | 1/1996 | Pechanek et al. | 706/41 |
| 5,485,103 | 1/1996 | Pedersen et al. | 326/41 |
| 5,485,104 | 1/1996 | Agrawal et al. | 326/38 |
| 5,489,857 | 2/1996 | Agrawal et al. | 326/41 |
| 5,491,353 | 2/1996 | Kean | 257/208 |
| 5,493,239 | 2/1996 | Zlotnick | 326/38 |
| 5,497,498 | 3/1996 | Taylor | 395/284 |
| 5,506,998 | 4/1996 | Kato et al. | 395/800.29 |
| 5,510,730 | 4/1996 | El Gamal et al. | 326/41 |
| 5,511,173 | 4/1996 | Yamaura et al. | 395/598 |
| 5,513,366 | 4/1996 | Agarwal et al. | 395/800.22 |
| 5,521,837 | 5/1996 | Frankle et al. | 364/491 |
| 5,522,083 | 5/1996 | Gove et al. | 395/800.22 |
| 5,532,693 | 7/1996 | Winters et al. | 341/51 |
| 5,532,957 | 7/1996 | Malhi | 365/154 |
| 5,535,406 | 7/1996 | Kolchinsky | 395/800.1 |
| 5,537,057 | 7/1996 | Leong et al. | 326/41 |
| 5,537,601 | 7/1996 | Kimura et al. | 395/800.35 |
| 5,541,530 | 7/1996 | Cliff et al. | 326/41 |
| 5,544,336 | 8/1996 | Kato et al. | 395/311 |
| 5,548,773 | 8/1996 | Kemney et al. | 395/800.11 |
| 5,555,434 | 9/1996 | Carlstedt | 395/800.33 |
| 5,559,450 | 9/1996 | Ngai et al. | 326/40 |
| 5,561,738 | 10/1996 | Kinerk et al. | 706/4 |
| 5,570,040 | 10/1996 | Lytle et al. | 326/41 |
| 5,583,450 | 12/1996 | Trimberger et al. | 326/41 |
| 5,586,044 | 12/1996 | Agrawal et al. | 364/489 |
| 5,587,921 | 12/1996 | Agrawal et al. | 364/489 |
| 5,588,152 | 12/1996 | Dapp et al. | 395/800.16 |
| 5,590,345 | 12/1996 | Barker et al. | 395/800.11 |
| 5,659,797 | 8/1997 | Zandveld et al. | 710/22 |
| 5,844,888 | 12/1998 | Markkula, Jr. et al. | 370/255 |

OTHER PUBLICATIONS

Meyers, G., Advances in Computer Architecture, Wiley–Interscience Publication, 2nd ed., John Wiley & Sons, Inc. pp. 463–494, 1978.

M. Saleeba, "A Self–Contained Dynamically Reconfigurable Processor Architecture", Sixteenth Australian Computer Science Conference, ASCS–16 QLD, Australia, Feb., 1993.

M. Moriis Mano, "Digital Design," by Prentice Hall, Inc., Englewood Cliffs, New Jersey 07632, 1984, pp. 119–125, 154–161.

Maxfield C. "Logic that Mutates While–U–Wait" EDN (Bur. Ed) (USA), EDN (European Edition), Nov. 7, 1996, Cahners Publishing, USA.

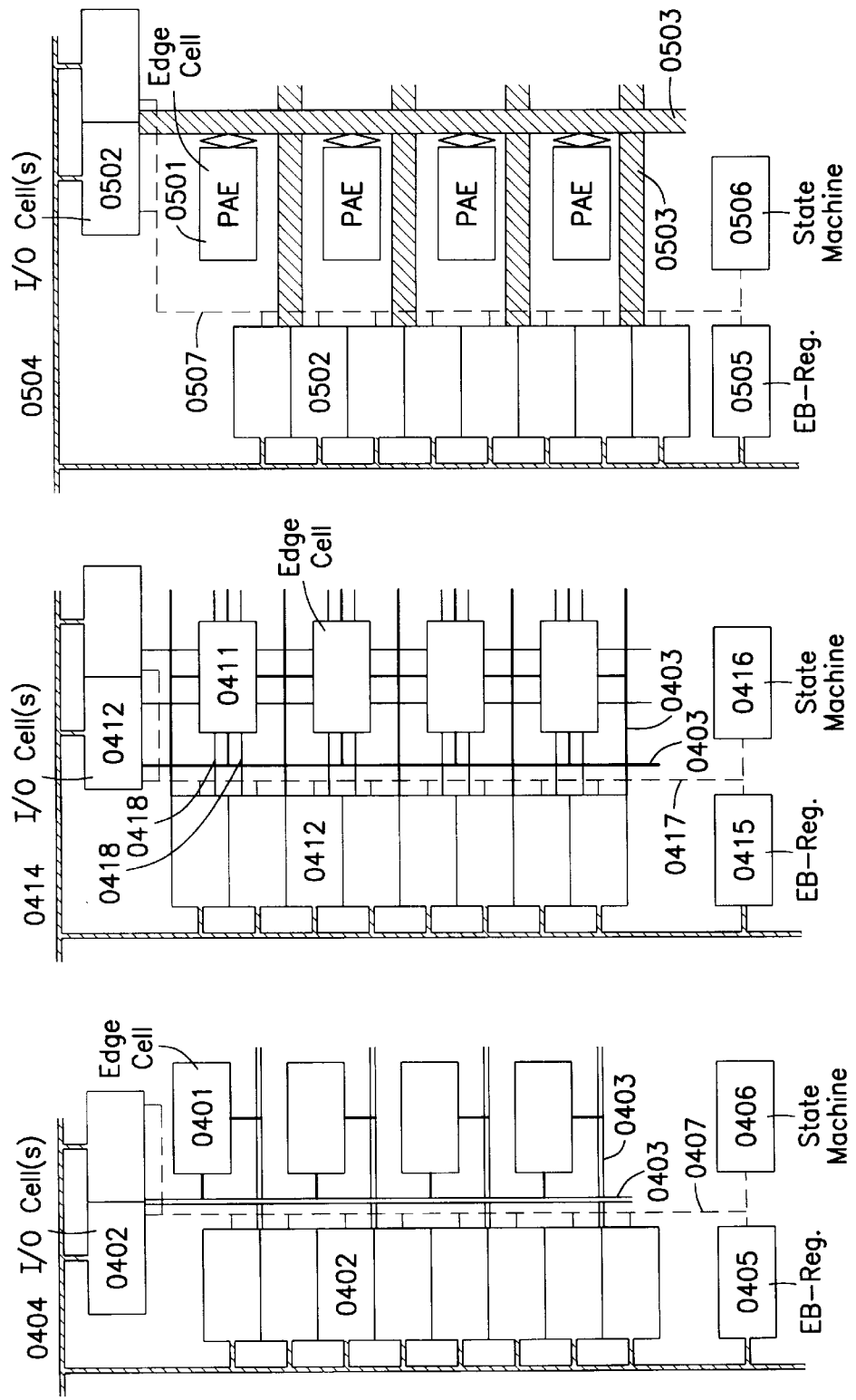

I/O AND MEMORY BUS SYSTEM FOR DFPS AND UNITS WITH TWO- OR MULTI-DIMENSIONAL PROGRAMMABLE CELL ARCHITECTURES

FIELD OF THE INVENTION

The present invention relates to I/O and memory bus systems.

BACKGROUND INFORMATION

In German Patent No. DE 44 16 881 A1, a data flow processor ("DFP") is described in which the lines of each edge cell (i.e., a cell at the edge of a cell array, often in direct contact with the terminals of the unit) are guided out via the terminals of the unit. The lines do not have any specific function, and instead they assume the function implemented in the edge cells. If several DFPs are interconnected, all terminals are connected to form a matrix.

In systems with two- or multi-dimensional programmable cell architectures (FPGAs, DPGAs), a certain subset of internal bus systems and lines of the edge cells are connected to the outside via the unit terminals. The lines do not have any specific function, and instead they assume the function written in the edge cells. If several FPGAs/DPGAs are interconnected, the terminals assume the function implemented in the hardware or software.

The wiring expense for the periphery or for interconnecting DFPs is very high, because the programmer must ensure that the respective functions are integrated into the cells of the DFP(s) at the same time. For connecting a memory, a memory management unit must be integrated into the unit. Connection of peripherals must also be supported. Additionally, the cascading of DFPs must be similarly taken into account. Not only is the expense relatively high, but also area on the unit is lost for the respective implementations. This also applies to FPGAs and DPGAS, particularly when they are used for implementation of algorithms and when they work as arithmetic (co)processors.

SUMMARY OF THE INVENTION

An object of the present invention is to reduce the expense of wiring, and in particular to reduce the number of unit terminals. The present invention provides a uniform bus system which operates without any special consideration by the programmer. The present invention includes a permanent implementation of the bus system control. Memories and peripherals can be connected to the bus system without any special measures. Likewise, units can be cascaded with the help of the bus system.

The present invention in accordance with an exemplary embodiment provides a general bus system which combines a number of internal lines, and leads them as a bundle to the terminals. The bus system control is predefined and does not require any influence by the programmer. Any number of memories, peripherals or other units can be connected to the bus system (e.g., for cascading).

BRIEF DESCRIPTION OF THE DRAWINGS

FIGS. 4a and 4b illustrate line bundling in FPGAs in accordance with an exemplary embodiment of the present invention.

FIG. 5 illustrates line bundling in DFPs in accordance with an exemplary embodiment of the present invention.

DETAILED DESCRIPTION OF THE INVENTION

Figure 1:
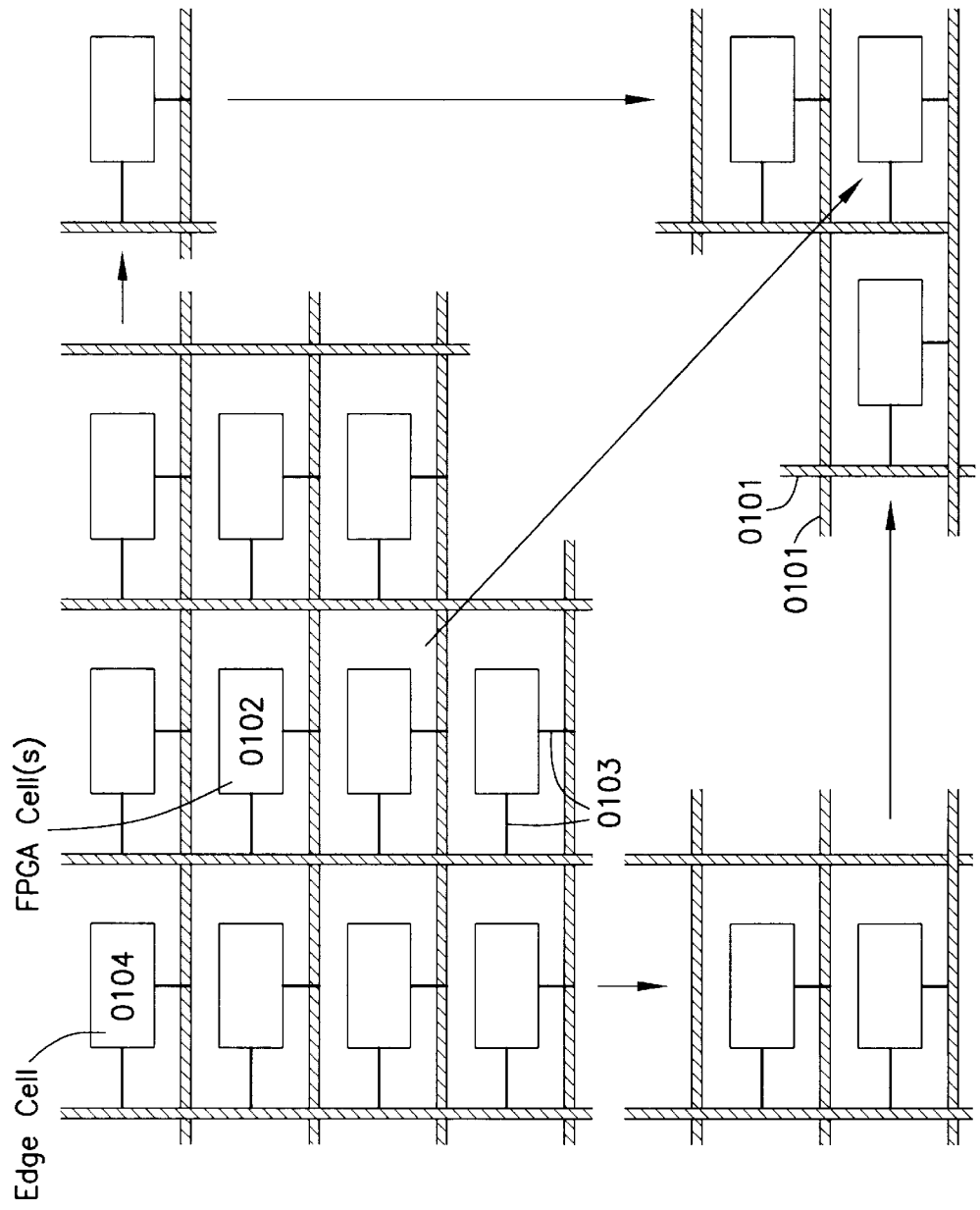
FIG. 1 illustrates a basic unit as a type A FPGA.

The following description encompasses several architectures which may be controlled and configured by a primary logic unit, as in DFPs, FPGAs, DPGAs, etc. Parts of the primary logic unit may be integrated on the unit. As an alternative, there is the possibility (FIGS. 6, 7) of dynamically controlling or reconfiguring the architectures directly through the unit itself. The architectures may be implemented in a permanent form on the unit, or they may be created only by configuring and possibly combining multiple logic cells, i.e., configurable cells which fulfill simple logical or arithmetic functions according to their configuration (cf. DFP, FPGA, DPGA).

Bundling Internal Lines:

To obtain appropriate bus architectures, a plurality of internal lines are combined in buses (I-BUSn, where n denotes the number of the bus). The lines may be internal bus systems or lines of the edge cells. For write access to the external bus (E-Bus) over clocked latches or registers (I-GATE-REG), the individual buses are connected to gates that function as switches to the E-BUS. Such a unit is called an OUTPUT CELL. Access to the E-BUS takes place in such a way that the individual latches are switched via the gates to the common E-BUS. There is always only one gate open. Each I-BUSn has a unique identification number (n: e.g., I-BUS1, I-BUS976, . . . ).

For read access, the incoming E-BUS is stored temporarily in clocked latches or registers (E-GATE-REG) and then distributed over the gates to the I-BUSn. Such a unit is called an INPUT CELL. Pick up from the E-BUS takes place in such a way that an E-BUS transfer is written into one or more E-GATE-REGs. The E-GATE-REGs can then be switched either individually or together to their internal bus systems.

The read/write accesses can take place in any order. Under some circumstances, it is appropriate to subdivide the internal buses I-BUSn into two groups, the writing output buses IO-BUSn and the reading input buses II-BUSn.

Address Generation:

For most accesses to external units, it is necessary to generate addresses for selecting a unit or parts of a unit. The addresses may be permanent, i.e., they do not change (this is the case especially with peripheral addresses) or the addresses may change by (usually) fixed values with each access (this is the case especially with memory addresses). For generating the addresses, there are programmable counters for read accesses and programmable counters for write accesses. The counters are set at a base value by the PLU, which is the unit that configures the configurable units (DFPs, FPGAs, DPGAs, etc.) based on cell architecture. With each access to the gate, the counter is incremented or decremented by a value defined by the PLU, depending on the setting. Likewise, each counter can also be used as a register, which means that counting is not performed with each access, and the value set in the counter is unchanged. The value of the counter belonging to the gate is assigned as an address to each bus transfer. The counter is set by a setting register (MODE PLUREG) to which the PLU has write access.

Masks and States:

Each gate is assigned a number of bits in MODE PLUREG which is described below, indicating whether the gate is active or is skipped by the controller, i.e., is masked out (MASK). This means that the gate is skipped in running through all gates to connect to the respective bus system.

The following mask records are conceivable:
always skip the INPUT/OUTPUT CELL,
skip the INPUT/OUTPUT CELL only in writing,
skip the INPUT/OUTPUT CELL only in reading if the E-BUS MASTER has not accessed the INPUT/OUTPUT CELL,
never skip the INPUT/OUTPUT CELL.

Each gate is assigned a state register which may be designed as an RS flip-flop. This register indicates whether data have been written into the register belonging to the gate.

MODE PLUREG:

The MODE PLUREG can be written and read by the PLU. It serves to set the bus system.

One possible MODE PLUREG architecture from the standpoint of PLU is illustrated below:

| Bit 1-m | Bit k-1 | Bit 2-k | Bit 1 | Bit 0 |
|---|---|---|---|---|
| Mask | Predefined value | Step length | 0 = additive counting<br>1 = subtractive counting | 0 = register<br>1 = counter |
| Masking | | | Settings for address generator | |

Description of the INPUT CELL:

A distinction is made according to whether data goes from the E-BUS to the unit (the component required for this is called the INPUT CELL) or whether data goes from the unit to the E-BUS (the component required for this is called an OUTPUT CELL).

An INPUT CELL may be designed as follows. A latch (I-GATE-REG) which is controlled either by the external E-BUS MASTER or the internal state machine serves as a buffer for the data received from the E-BUS. The clock pulse of the latch is sent to (for example) an RS flip-flop (SET-REG) which retains access to the I-GATE-REG. Downstream from the I-GATE-REG is a gate (I-GATE) which is controlled by the state machine. The data goes from the I-GATE-REG to the I(I)-BUSn via the I-GATE.

In addition, there is a programmable incrementer/decrementer in the INPUT CELL. It can be controlled by the state machine after each active read access to the E-BUS to increment or decrement an adjustable value. It can also serve as a simple register. This counter generates the addresses for bus accesses where the unit is E-BUS MASTER. The addresses are sent to the E-BUS via a gate (ADR-GATE). The ADR-REG is controlled by the state machine.

The E-BUS MASTER can poll the state of the SET-REG via another gate (STATE-GATE). Each INPUT CELL has a MODE PLUREG in which the PLU configures the counter and turns the INPUT CELL on or off (masks it).

Description of the OUTPUT CELL:

An OUTPUT CELL may be configured as follows. A latch (E-GATE-REG) which is controlled by the internal state machine provides buffer storage for the data obtained from the I-BUS.

In addition, there is a programmable incrementer/decrementer in the OUTPUT CELL. The clock signal of the latch is sent to (for example) an RS flip-flop (SET-REG) which retains access to the E-GATE-REG. It can be controlled by the state machine after each read access to the E-BUS to increment or decrement an selectable value. It can also function as a simple register. This counter generates the addresses for bus accesses in which the unit is E-BUS MASTER.

The data of the E-GATE-REG, the addresses and the state of the SET-REG are sent to the E-BUS via a gate (E-GATE) which is controlled either by the external E-BUS MASTER or the internal state machine. Each OUTPUT CELL has a MODE PLUREG in which the PLU configures the counter and turns the OUTPUT CELL on and off (masks it).

Controlling the Bus System:

At a higher level than the individual gates, address generators and masks, there is a controller consisting of a simple, known state machine. Two operating modes are differentiated:

1. An active mode in which the state machine controls the internal bus (I-BUS) and the external bus (E-BUS). This mode is called E-BUS MASTER because the state machine has control of the E-BUS.
2. A passive mode in which the state machine controls only the internal bus (I-BUS). The E-BUS is controlled by another external unit. The state machine reacts in this mode to the requirements of the external E-BUS MASTER. This mode of operation is called E-BUS SLAVE.

The controller manages the E-BUS protocol. The sequence differs according to whether the controller is functioning in E-BUS MASTER or E-BUS SLAVE mode. No bus protocol is described in this paper, because a number of known protocols can be implemented.

E-BUS MASTER and E-BUS SLAVE, EB-REG:

The E-BUS control register (EB-REG) is provided to manage the data traffic on the E-BUS. It is connected in series with the gates and can be addressed and operated from the E-BUS. The data exchange can be regulated through the following records:

I-WRITE: indicates that the I-BUS is written completely into the INPUT/OUTPUT CELLs, I-READ: indicates that the I-BUS has completely read the INPUT/OUTPUT CELLs, E-WRITE: indicates that the E-BUS has been written completely into the INPUT/OUTPUT CELLs, E-READ: indicates that the E-BUS has completely read the INPUT/OUTPUT CELLs.

The EB-REG is always active only on the side of the E-BUS SLAVE, and the E-BUS MASTER has read and write access to it.

All I- . . . records are written by the E-BUS SLAVE and read by the E-BUS MASTER.

All E- . . . records are written by the E-BUS MASTER and read by the E-BUS SLAVE, An E-BUS SLAVE can request control of the E-BUS by setting the REQ MASTER bit in its EB-REG. If the E-BUS MASTER recognizes the REQ MASTER bit, it must relinquish the bus control as soon as possible. It does this by setting the MASTER bit in the EB-REG to that of an E-BUS SLAVE. It then immediately switches the E-BUS to passive mode. The old E-BUS SLAVE becomes the new E-BUS MASTER, and the old E-BUS MASTER becomes the new E-BUS SLAVE. The new E-BUS MASTER assumes control of the E-BUS. To recognize the first E-BUS MASTER after a RESET of the system, there is a terminal on each unit which indicates, by the preset polarity, whether the unit is E-BUS MASTER or E-BUS SLAVE after a RESET. The MASTER record in the EB-REG can also be set and reset by the PLU. The PLU must be sure that there are no bus collisions on the EB-BUS and that no ongoing transfers are interrupted.

E-BUS MASTER Writes Data to E-BUS SLAVE:

The E-BUS MASTER can write data to the E-BUS SLAVE as follows:

The data transfer begins when the state machine of the E-BUS MASTER selects an OUTPUT CELL that is not masked out.

Data has already been stored in the I-GATE REG, depending on the design of the state machine, or the data is stored now.

The gate is activated.

The valid read address is transferred to the bus.

The data goes to the E-BUS and is stored in the E-GATE REG of the E-BUS SLAVE.

The SET-REG in the E-BUS SLAVE is thus activated.

The gate in the E-BUS MASTER is deactivated.

The address counter generates the address for the next access.

The transfer is terminated for the E-BUS MASTER.

There are two possible embodiments of the E-BUS SLAVE for transferring data from the bus to the unit:

1. The data gate is always open and the data goes directly from the E-GATE-REG to the I-BUSn.
2. The state machine recognizes that SET-REG is activated, and it activates the gate, so that SET-REG can be reset.

The E-BUS MASTER can notify the E-BUS SLAVE when a complete bus cycle is terminated (a bus cycle is defined as the transfer of multiple data strings to different E-GATE-REGS, where each E-GATE-REG may be addressed exactly once).

The E-BUS MASTER sets the E-WRITE bit in the EB-REG of the E-BUS SLAVE at the end of a bus cycle.

The E-BUS SLAVE can respond by polling the INPUT CELLs.

When it has polled all the INPUT CELLs, it sets the I-READ bit in its EB-REG.

It then resets E-WRITE and all the SET-REGs of the INPUT CELLS.

The E-BUS MASTER can poll I-READ and begin a new bus cycle after its activation.

I-READ is reset by E-WRITE being written or the first bus transfer.

The E-BUS SLAVE can analyze whether the INPUT CELLs can/must be read again on the basis of the status of the EB-REG or the individual SET-REGs of the INPUT CELLs.

E-BUS MASTER Reads Data from E-BUS SLAVE:

From the standpoint of the E-BUS MASTER, there are two basic methods of reading data from the E-BUS SLAVE:

1. Method in which the E-BUS data goes directly to the I-BUS:

The data transfer begins with the state machine of the E-BUS MASTER selecting an INPUT CELL which is not masked out.

The I-GATE and the ADR-GATE are activated.

The valid read address is transferred to the bus.

The I-GATE-REG is transparent, i.e., it allows the data through to the I-BUSn.

The gate in the E-BUS MASTER is deactivated.

The address counter generates the address for the next access.

The transfer is terminated for the E-BUS MASTER.

2. Method in which the E-BUS data is stored temporarily in the I-GATE-REG:

The data transfer begins with the state machine of the E-BUS MASTER selecting an INPUT CELL which is not masked out.

The I-GATE and the ADR-GATE are activated.

The valid read address is transferred to the bus.

I-GATE-REG stores the data.

The gate in the E-BUS MASTER is deactivated.

The address counter generates the address for the next access.

The E-BUS transfer is terminated for the E-BUS MASTER.

All INPUT CELLS involved in the E-BUS transfer, which can be ascertained on the basis of the masks in the MODE PLUREG or the state of the SET-REG, are run through and the data is transferred to the respective I-BUS.

For the E-BUS SLAVE, the access may be accomplished as follows:

The gate is activated by the E-BUS.

The data and the state of any SET-REG that may be present go to the E-BUS.

The gate is deactivated.

The E-BUS MASTER can notify the E-BUS SLAVE when a complete bus cycle is terminated.

To do so, at the end of a bus cycle, the E-BUS MASTER sets the E-READ bit in the EB-REG of the E-BUS SLAVE.

E-BUS SLAVE can react by writing to the OUTPUT CELLs anew.

When it has written to all the OUTPUT CELLs, it sets the I-WRITE bit in its EB-REG.

In doing so, it resets E-READ and all the SET-REGs of the OUTPUT CELLS.

The E-BUS MASTER can poll I-WRITE and begin a new bus cycle after its activation.

I-WRITE is reset by writing E-READ or the first bus transfer.

The E-BUS SLAVE can evaluate on the basis of the state of the EB-REG or the individual SET-REGs of the OUTPUT CELLS whether the OUTPUT CELLs can/must be written anew.

Connection of Memories and Peripherals, Cascading:

In addition to cascading identical units (DFPs, FPGAs, DPGAs), memories and peripherals can also be connected as lower-level SLAVE units (SLAVE) to the bus system described here. Memories and peripherals as well as other units (DFPs, FPGAs) can be combined here. Each connected SLAVE analyzes the addresses on the bus and recognizes independently whether it has been addressed. In these modes, the unit addressing the memory or the peripheral, i.e., the SLAVE units, is the bus MASTER (MASTER), i.e., the unit controls the bus and the data transfer. The exception is intelligent peripheral units, such as SCSI controllers that can initiate and execute transfers independently and therefore are E-BUS MASTERs.

Through the method described here, bus systems can be connected easily and efficiently to DFPs and FPGAs. Both memories and peripherals as well as other units of the types mentioned above can be connected over the bus systems.

The bus system need not be implemented exclusively in DFPs, FPGAs and DPGAs. Hybrid operation of this bus system with traditional unit terminal architectures is of course possible. Thus the advantages of the respective technique can be utilized optimally.

Other sequencing methods are also conceivable for the bus system described herein.

FIG. 1:

FIG. 1 shows an FPGA, where 0101 represents the internal bus systems, 0102 includes one or more FPGA cells. 0103 denotes subbuses which are a subset of 0101 and are connected to 0101 via switches (crossbars). 0103 can also manage internal data of 0102 that are not switched to 0101. The FPGA cells are arranged in a two-dimensional array. 0104 is an edge cell located at the edge of the array and is thus in direct proximity to the terminals at the edge of the unit.

Figure 2:
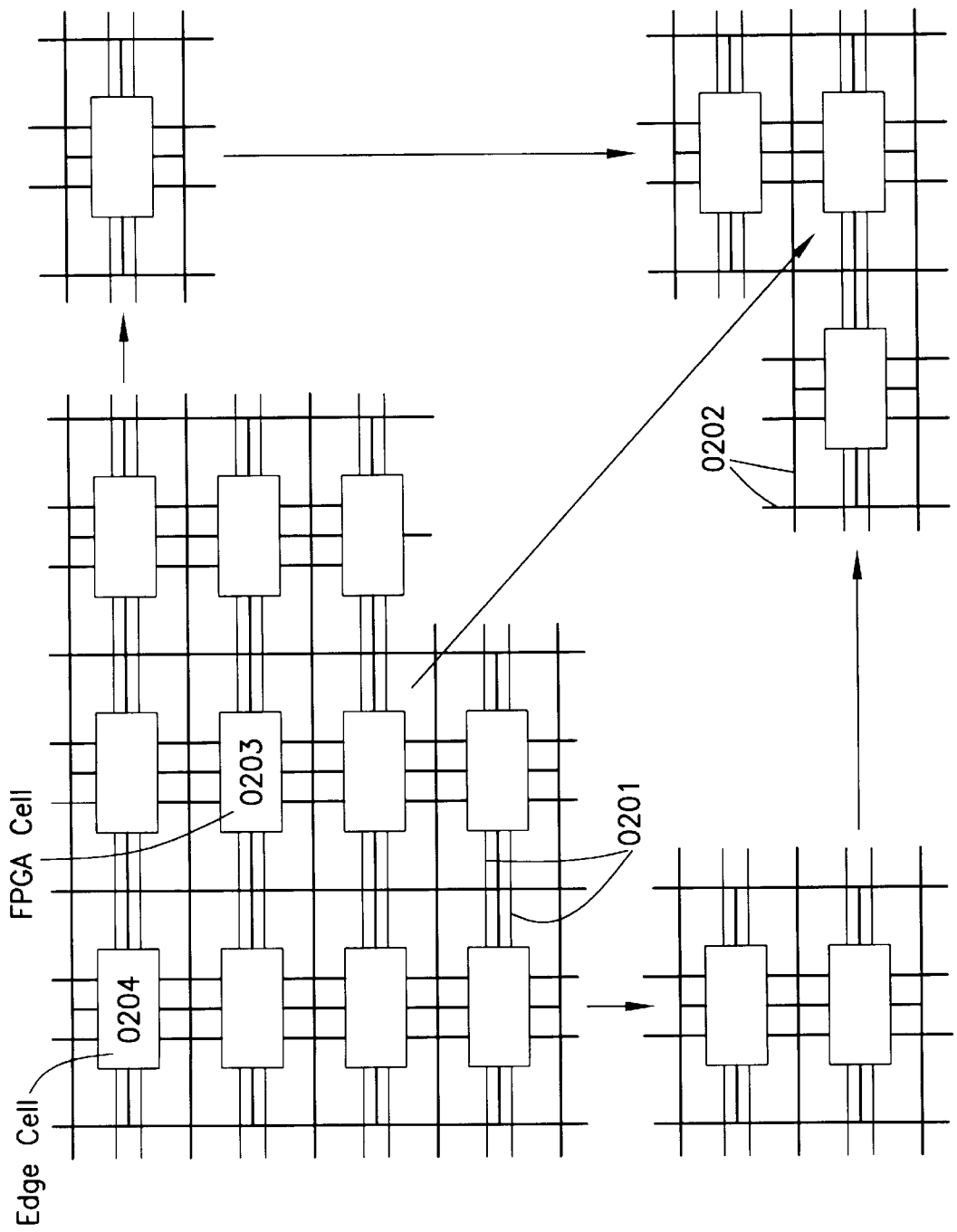
FIG. 2 illustrates a basic unit as a type B FPGA.

FIG. 2:

FIG. 2 shows another FPGA. This embodiment does not work with bus systems like 0101 but instead mainly with next-neighbor connections (0201) which are direct connections from an FPGA cell (0203) to a neighboring cell. Nevertheless, there can be global bus systems (0202), but they are not very wide. The FPGA cells or a group of FPGA cells have a connection to 0202. The FPGA cells or a group of FPGA cells have a connection to 0202. The FPGA cells are arranged in a two-dimensional array. 0204 is an edge cell located at the edge of the array and thus is in close proximity to the terminals at the edge of the unit.

Figure 3:
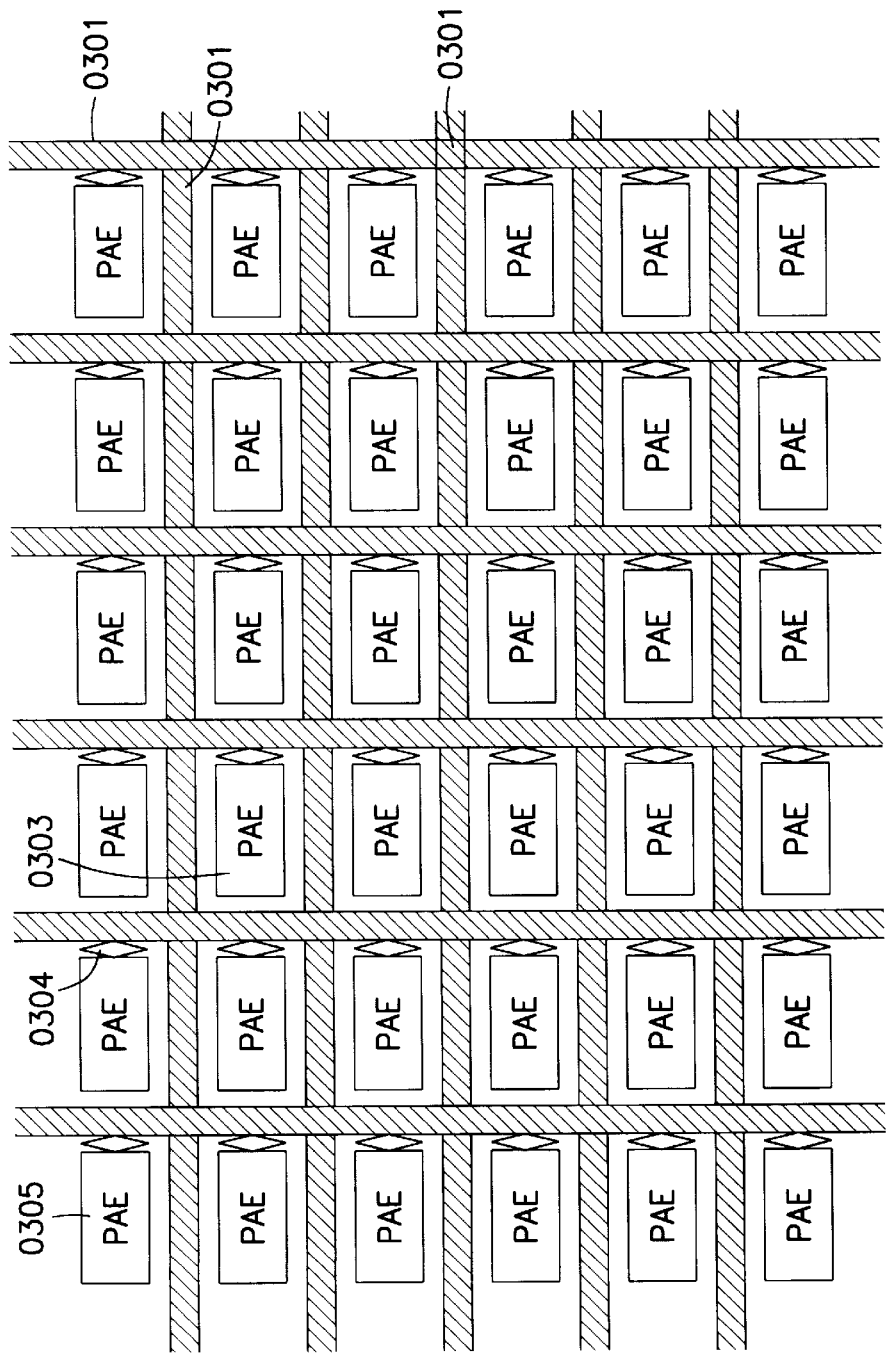
FIG. 3 illustrates a basic unit as a DFP.

FIG. 3:

FIG. 3 shows a PACT02 DFP (i.e., DE 44 16 881 A1). The PAE cells (0303) are wired to the bus systems (0301) via a bus interface (0304) in accordance with the present invention. Bus systems 0301 can be wired together via a bus switch (0302). The PAE cells are arranged in a two-dimensional array. 0305 is an edge cell located on the edge of the array and is thus in close proximity to the terminals at the edge of the unit.

FIG. 4a:

FIG. 4a shows an FPGA edge according to FIG. 1. Outside the edge cells (0401) there are arranged a plurality of INPUT/OUTPUT CELLs (0402) which connect the internal bus systems (0403) individually or in groups to the E-BUS (0404). The number of INPUT/OUTPUT CELLs depends on their own width in relation to the width of the internal bus systems. 0405 is an EB-REG. 0406 is a state machine. A bus system (0407) by means of which the state machine controls the INPUT/OUTPUT CELLs goes from the state machine to the EB-REG and each individual INPUT/OUTPUT CELL. There can be several 0405s and 0406s by combining a set of 0402s into groups, each managed by an 0405 and 0406.

FIG. 4b:

FIG. 4b shows an FPGA edge according to FIG. 2. Several INPUT/OUTPUT CELLs (0412) are arranged outside the edge cells (0411), with individual CELLs or groups of CELLs connected to the E-BUS (0414) via the internal bus systems (0413) and the direct connections of the edge cells (0417). The number of INPUT/OUTPUT CELLs depends on their own width in relation to the width of the internal bus systems (0413) and the number of direct connections (0418). 0415 is an EB-REG. 0416 is a state machine. A bus system (0417) by means of which the state machine controls the INPUT/OUTPUT CELLs goes from the state machine to the EB-REG and each individual INPUT/OUTPUT CELL. There may be multiple 0415s and 0416s by combining a number of 0412s into groups, each managed by a 0415 and 0416.

FIG. 5:

FIG. 5 shows a DFP edge according to FIG. 3. Outside the edge cells (0501) are arranged several INPUT/OUTPUT CELLs (0502) which are connected individually or in groups to the E-BUS (0504) by the internal bus systems (0503). The number of INPUT/OUTPUT CELLs depends on their own width in relation to the width of the internal bus systems (0503). 0505 is an EB-REG. 0506 is a state machine. The state machine controls the INPUT/OUTPUT CELLs via a bus system (0507) which goes from the state machine to the EB-REG and each individual INPUT/OUTPUT CELL. There may be multiple 0505s and 0506s by combining a number of 0412s into groups, each managed by a 0505 and 0506.

Figure 6:
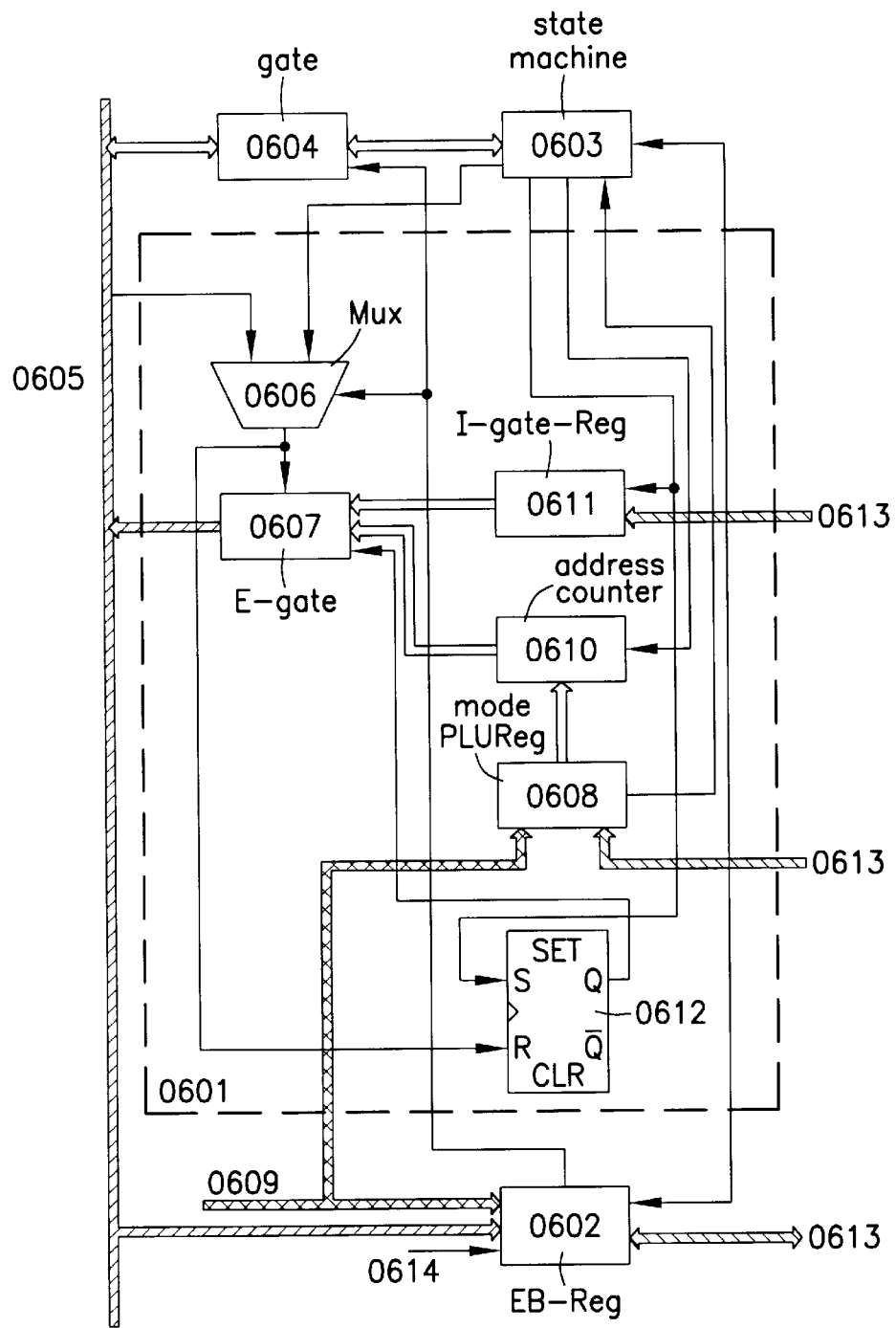
FIG. 6 illustrates an OUTPUT CELL in accordance with an exemplary embodiment of the present invention.

FIG. 6:

FIG. 6 shows an OUTPUT CELL 0601. Outside of 0601 there are the EB-REG (0602) and the state machine (0603) plus a gate (0604) which connects the state machine to the E-BUS (0605) if it is the E-BUS MASTER. Access to the EB-REG is possible via the E-BUS (0605), the I-BUS (0613) and the PLU bus (0609). In addition, when the unit is reset, the MASTER bit can be set via an external terminal (0614) leading out of the unit. The state machine (0603) has read and write access to 0602. In the OUTPUT CELL there is a multiplexer (0606) which assigns control of the E-GATE (0607) to either the E-BUS MASTER or the state machine (0603). The MODE PLUREG (0608) is set via the PLU bus (0609) or the I-BUS (0613) and it configures the address counter (0610) and the state machine (e.g., masking out the OUTPUT CELL). If data of the I-BUS (0613) is stored in the I-GATE-REG (0611), the access is noted in SET-REG (0612). The state of 0612 can be polled via 0607 on the E-BUS. Read access (E-GATE 0607 is activated) resets 0612. The addresses generated by 0610 and the data of 0611 are transferred to the E-BUS via gate 0607. There is the possibility of dynamically reconfiguring and controlling the OUTPUT CELL via the unit itself (DFP, FPGA, DPGA, etc.) rather than through the PLU. The I-BUS connection to the EB-REG (0602) and the MODE PLUREG (0608) serves this function.

Figure 7:
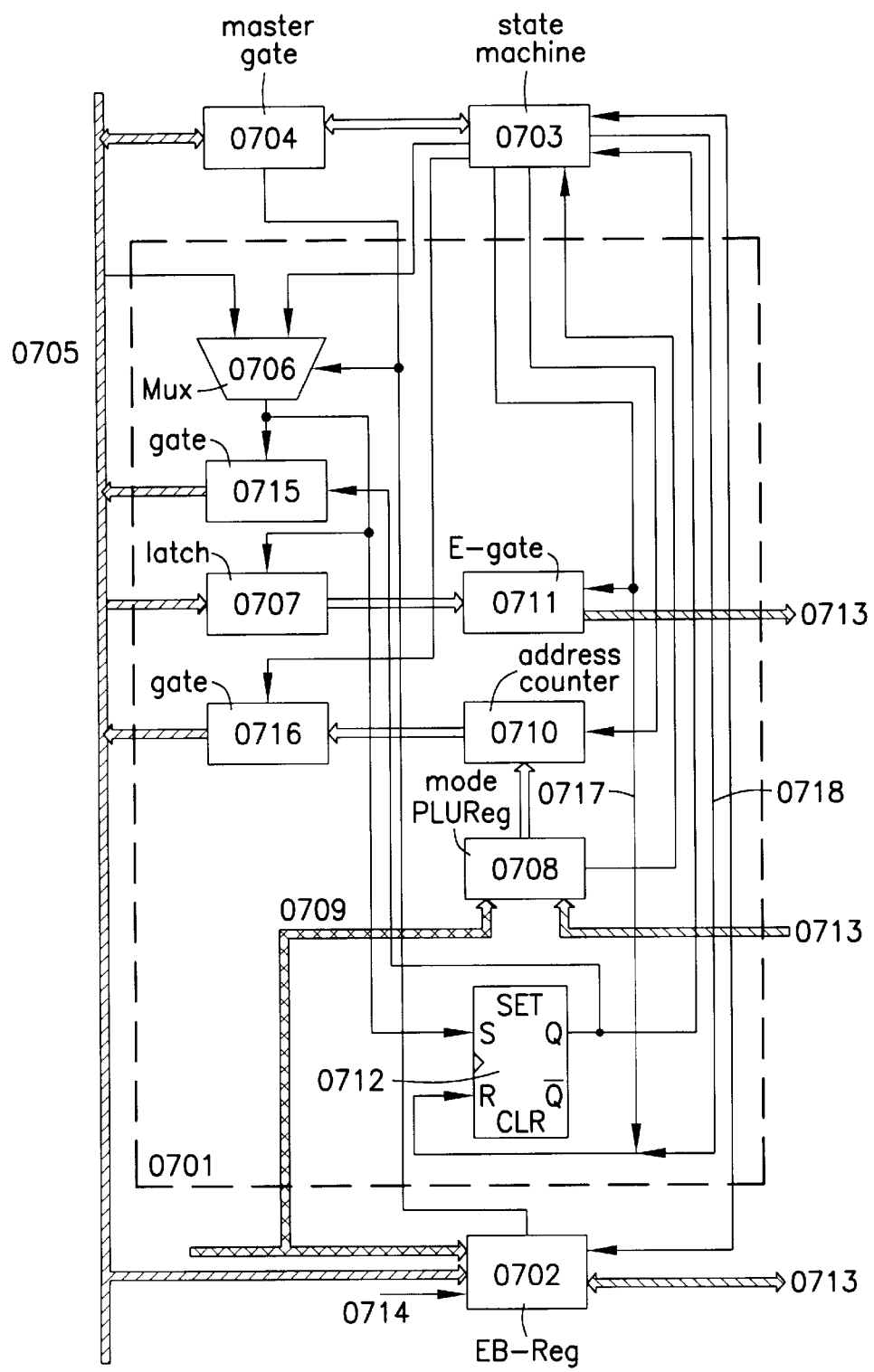
FIG. 7 illustrates an INPUT CELL in accordance with an exemplary embodiment of the present invention.

FIG. 7:

FIG. 7 shows an INPUT CELL 0701. Outside of 0701 there are the EB-REG (0702) and the state machine (0703), as well as a gate (MASTER GATE) (0704) which connects the state machine to the E-BUS (0705) if it is in the E-BUS MASTER mode. Access to EB-REG is possible via the E-BUS (0705), the I-BUS (0713) and the PLU bus (0709). Furthermore, when the unit is reset, the MASTER bit can be set via an external terminal (0714) leading out of the unit. The state machine (0703) has read and write access to 0702. In the INPUT CELL there is a multiplexer (0706) which assigns control of the E-GATE-REG (0707) to either the E-BUS MASTER or the state machine (0703). The MODE PLUREG (0708) is set via the PLU bus (0709) or the I-BUS (0713) and it configures the address counter (0710) and the state machine (e.g., masking out the INPUT CELL). If data of the E-BUS (0705) is stored in the E-GATE-REG (0707), the access is noted in the SET-REG (0712). The state of 0712 can be polled on the E-BUS via a gate (0715) whose control is the same as that of the latch (0707) A read access-E-GATE 0711 is activated and the data goes to the I-BUS (0713)—resets 0712 via 0717. As an alternative, 0712 can be reset (0718) via the state machine (0703) The addresses generated by 0710 are transferred via the gate (ADR-GATE) 0716 to the E-BUS. 0716 is activated by the state machine (0703) when it is E-BUS MASTER. There is the possibility of dynamically reconfiguring and controlling the INPUT CELL via the unit itself (DFP, FPGA, DPGA, etc.) instead of through the PLU. The I-BUS connection to the EB-REG (0702) and the MODE PLUREG (0708) serves this function.

Figure 8:
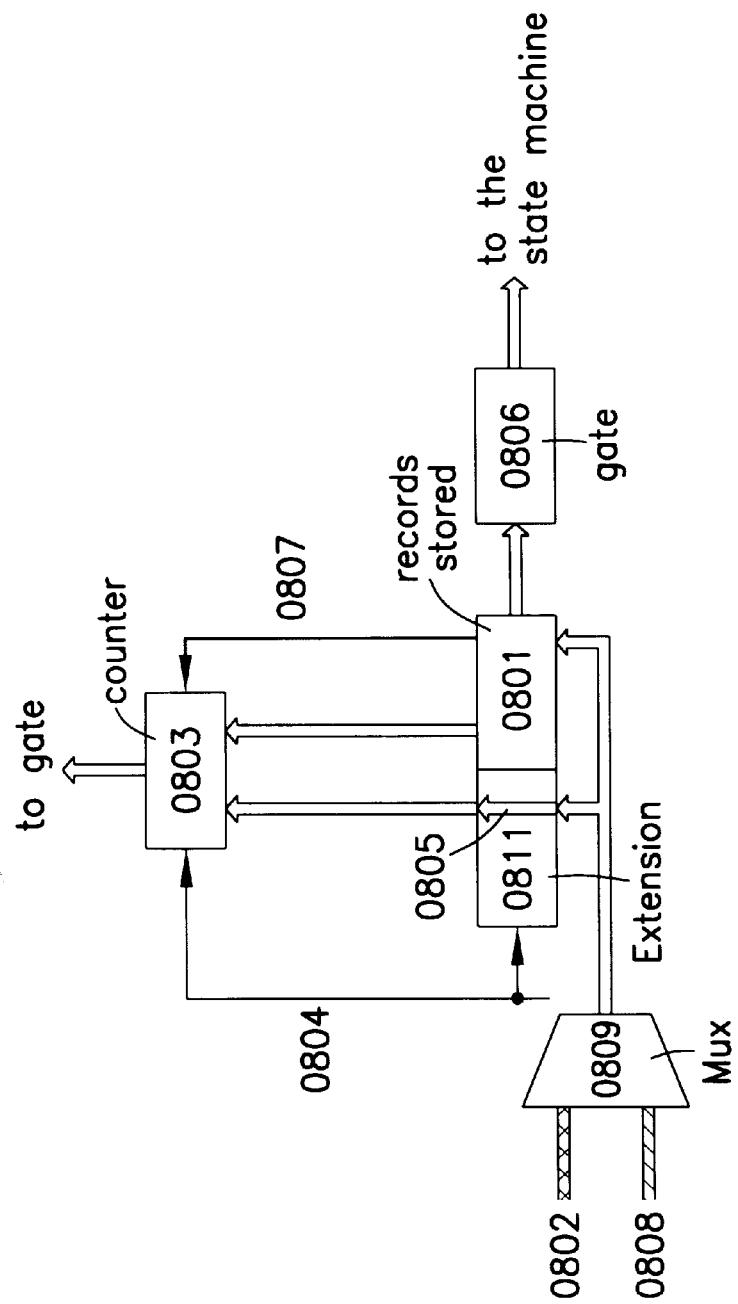
FIG. 8 illustrates address generation in accordance with an exemplary embodiment of the present invention.

FIG. 8:

FIG. 8 shows the MODE PLUREG of an INPUT or OUTPUT CELL written by the PLU via the PLU bus (0802) or via an I-BUS (0808). The respective bus system is selected by the multiplexer (0809) (control of the multiplexer is not shown because an ordinary decoder logic can be used). The counter settings such as step length, counting direction and enabling of the counter are sent directly (0807) to the counter (0803). The basic address can either be written directly (0805) into the counter via a load (0804) or stored temporarily in an extension (0811) of 0801. Records in 0801 that are relevant for the state machine go to the state machine via a gate (0806) which is opened by the state machine for the INPUT or OUTPUT CELL activated at the time.

Figure 9B:
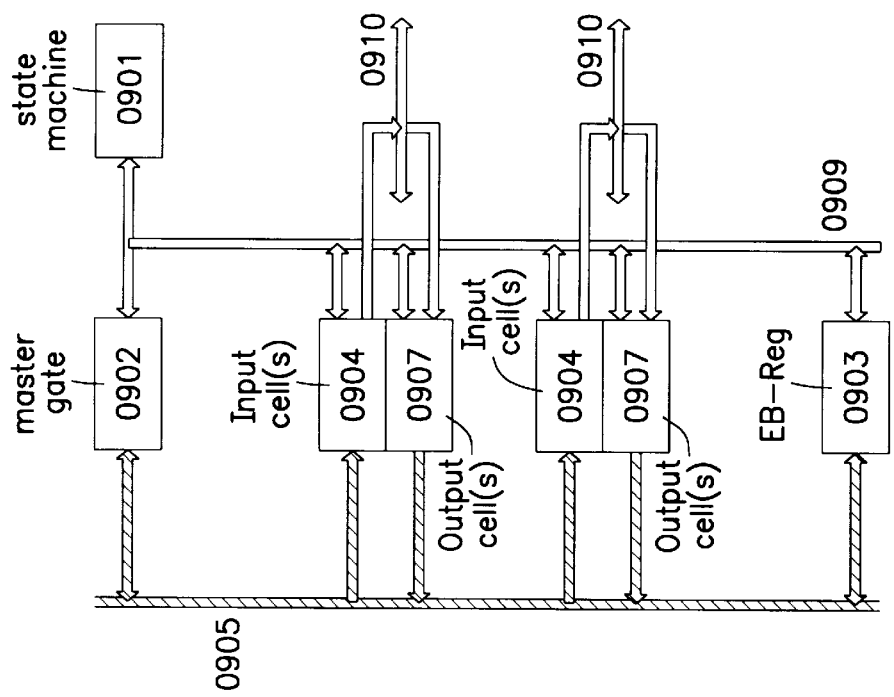
FIGS. 9a–9b illustrate a complete bus system with controller in accordance with an exemplary embodiment of the present invention.
Figure 9A:
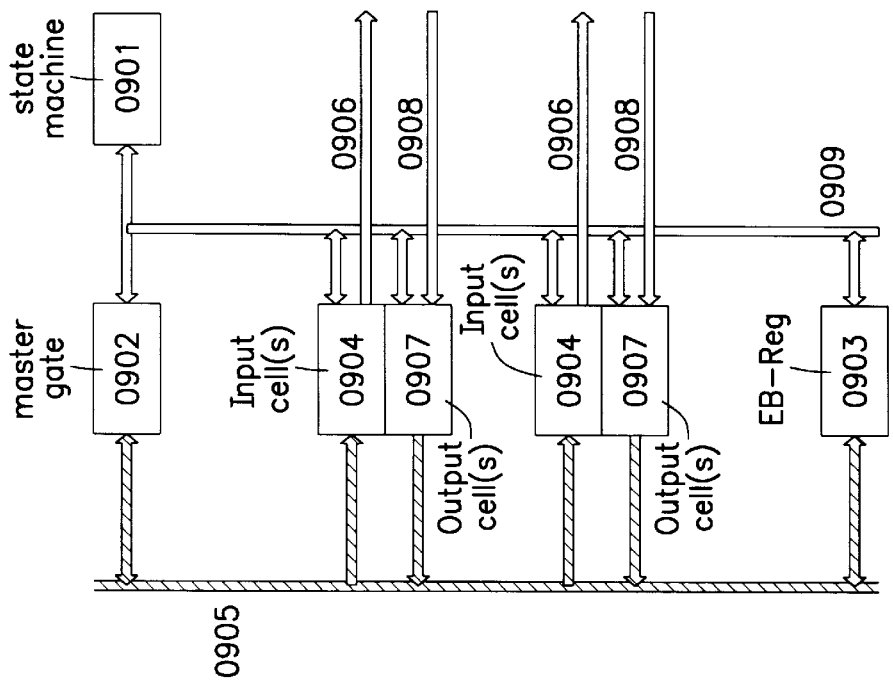

FIG. 9a:

FIG. 9a shows a bus interface circuit with a state machine (0901), MASTER GATE (0902) and EB-REG (0903). The INPUT CELLs (0904) transfer data from the E-BUS (0905) to the II-BUS (0906). The OUTPUT CELLs (0907) transfer data from the IO-BUS (0908) to the E-BUS (0905). All units are linked together by the control bus (0909).

FIG. 9b:

FIG. 9b shows a bus interface circuit with state machine (0901), MASTER GATE (0902) and EB-REG (0903). The INPUT CELLs (0904) transfer data from the E-BUS (0905) to the bidirectional I-BUS (0910). The OUTPUT CELLS (0907) transfer data from the bidirectional I-BUS (0910) to the E-BUS (0905). All units are linked together over the control bus (0909). Interface circuits which use both possibilities (FIGS. 9a and 9b) in a hybrid design are also conceivable.

Figure 10A:
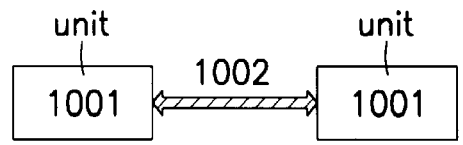
FIGS. 10a–10g illustrate the connection of memories and peripherals in accordance with an exemplary embodiment of the present invention.
Figure 10B:
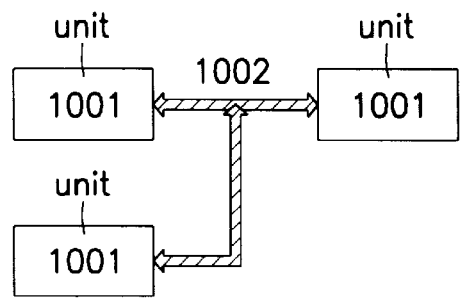

FIG. 10a:

FIG. 10a shows the interconnections of two units (DFPs, FPGAs, DPGAs, etc.) (1001) interconnected via the E-BUS (1002).

Figure 10C:
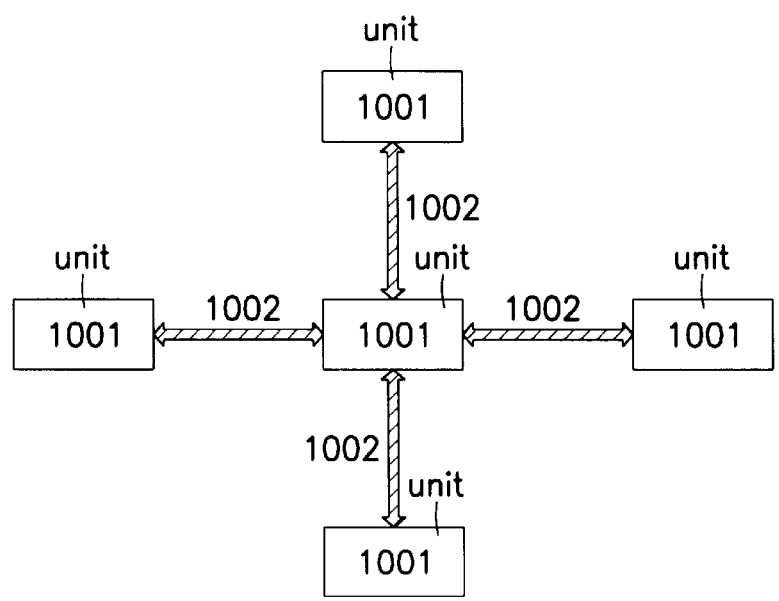

FIG. 10b:

FIG. 10c shows the interconnection of a number of units (DFPs, FPGAs, DPGAs, etc.) (1001) via the E-BUS (1002).

FIG. 10c:

FIG. 10c shows the interconnection of a number of units (DFPs, FPGAs, DPGAs, etc.) (1001) via the E-BUS (1002). The interconnection can be expanded to a matrix. One unit (1001) may also manage multiple bus systems (1002).

Figure 10D:
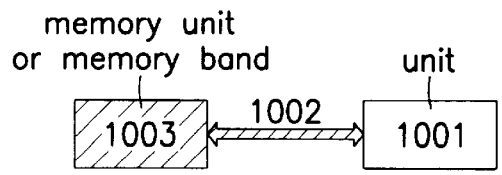

FIG. 10d:

FIG. 10d shows the interconnection of a unit (DFP, FPGA, DPGA, etc.) (1001) to a memory unit or a memory bank (1003) via the E-BUS (1002).

Figure 10E:
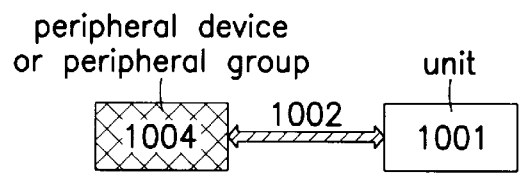

FIG. 10e:

FIG. 10e shows the interconnection of a unit (DFP, FPGA, DPGA, etc.) (1001) to a peripheral device or a peripheral group (1004) via the E-BUS (1002).

Figure 10F:
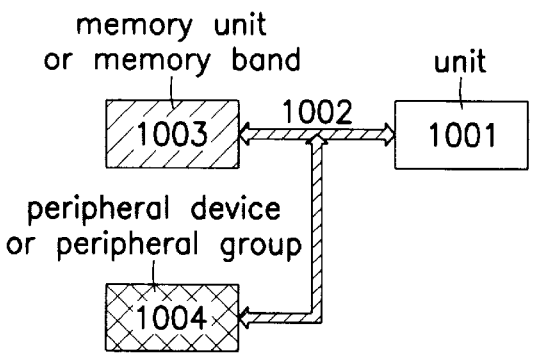

FIG. 10f:

FIG. 10f shows the interconnection of a unit (DFP, FPGA, DPGA, etc.) (1001) to a memory unit or a memory bank (1003) and to a peripheral device or a peripheral group (1004) via the E-BUS (1002).

Figure 10G:
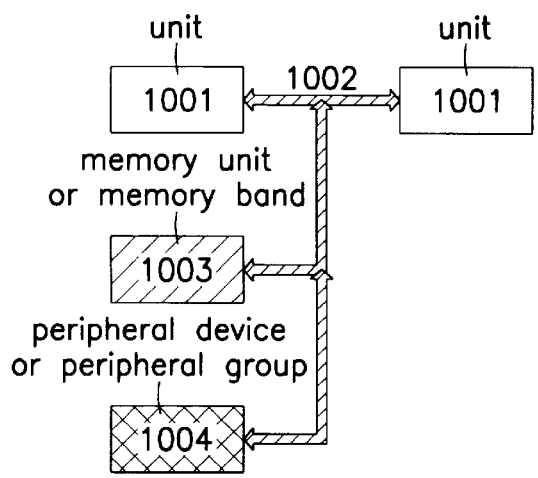

FIG. 10g:

FIG. 10g shows the interconnection of a unit (DFP, FPGA, DPGA, etc.) (1001) to a memory unit or a memory bank (1003) and to a peripheral device or a peripheral group (1004) plus another unit (DFP, FPGA, DPGA, etc.) (1001) via the E-BUS (1002).

Figure 11:
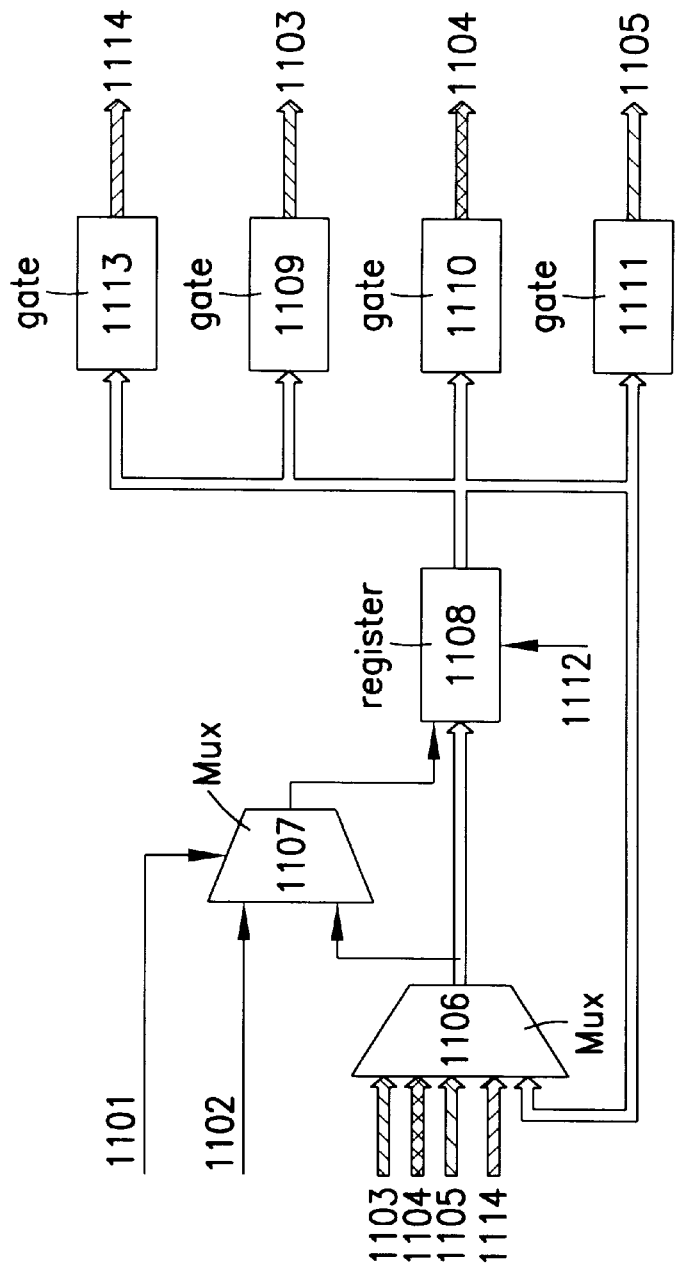
FIG. 11 illustrates an E-bus control register in accordance with an exemplary embodiment of the present invention.

FIG. 11:

FIG. 11 shows the architecture of the EB-REG. The bus systems E-BUS (1103), the PLU bus (1104) over which the PLU has access to the EB-REG, and the local internal bus between the INPUT/OUTPUT CELLs, the state machine and the EB-REG (1105, see 0407, 0417, 0517) and possibly an I-BUS (1114) are connected to a multiplexer (1106). The multiplexer (1106) selects either one of the buses or the feedback to the register (1108) and switches the data through to the input of the register (1108). The MASTER bit is sent separately over the multiplexer (1107) to the register (1108). The multiplexer is controlled by the RESET signal (1101) (resetting or initializing the unit). If a RESET signal is applied, the multiplexer (1107) switches the signal of an external chip connection (1102) through to the input of the register (1108); otherwise the output of the multiplexer (1106) is switched through to the input of the register (1108). Thus MASTER may be preallocated. The register (1108) is clocked by the system clock (1112). The contents of the register (1108) are switched via a gate (1109, 1110, 1111, 1113) to the respective bus system (1103, 1104, 1105, 1114) having read access at that time. The control of the gates (1109, 1110, 1111, 1113) and of the multiplexer (1106) is not shown because an ordinary decoder logic may be used.

Figure 12:
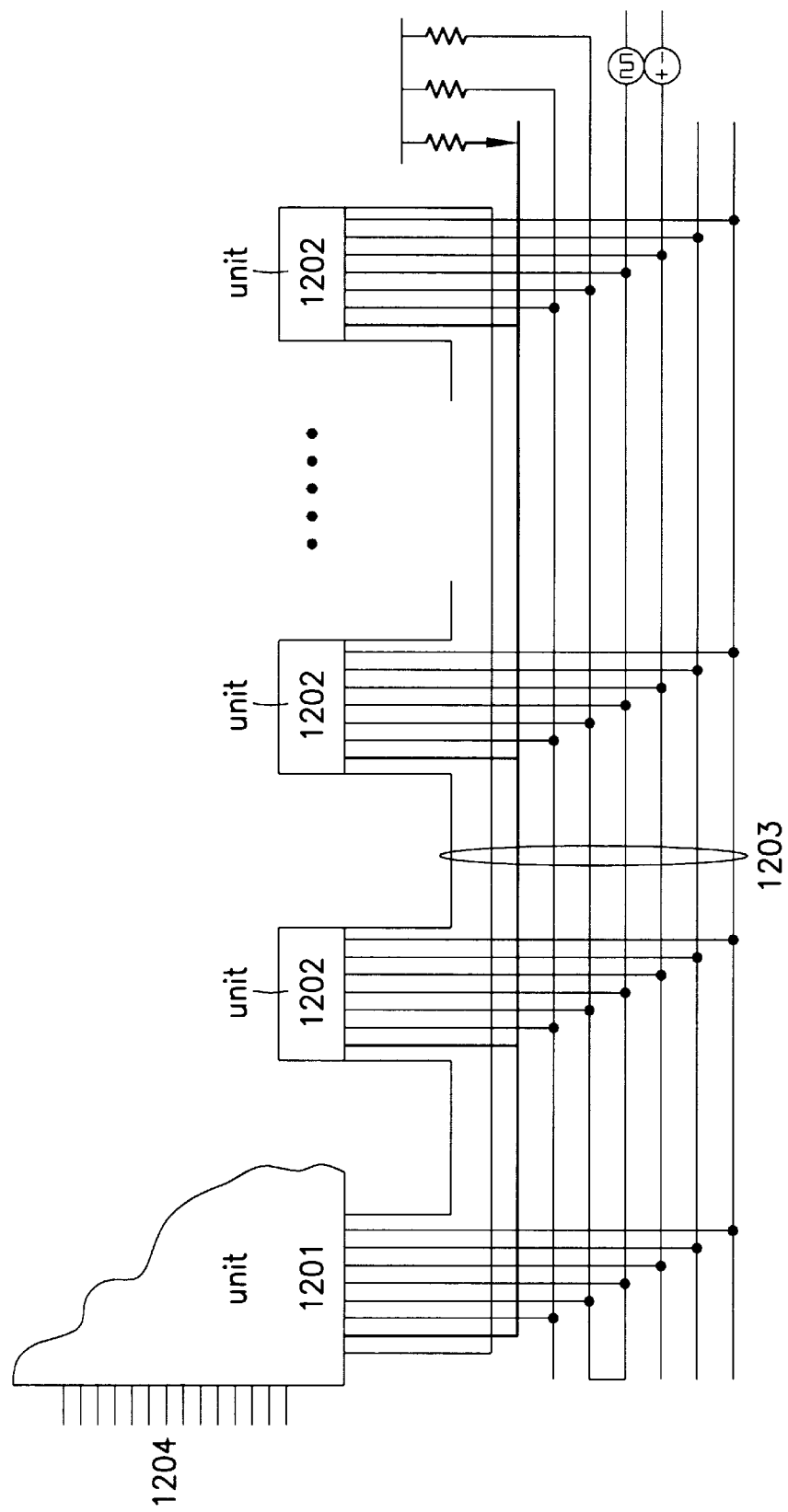
FIG. 12 illustrates an embodiment of the present invention employing RAMBUS.

EMBODIMENTS:

FIG. 12 shows an example using the standard bus system RAMBUS (1203). A unit (DFP, FPGA, DPGA, etc.) (1201) is connected to other units (memories, peripherals, other DFPs, FPGAs, DPGAs, etc.) (1202) over the bus system (1203). Independently of the bus system (1203), the unit (1201) may have additional connecting lines (1204), e.g., as is customary in the related art, for connecting any desired circuits.

Definition of Terms:

The following is a definition of terms used above.

ADR-GATE: Gate which switches addresses to the E-BUS if the unit is in E-BUS MASTER mode.

DFP: Data flow processor according to German Patent DE 44 16 881.

DPGA: Dynamically programmable gate array. Related art.

D flip-flop: Storage element which stores a signal at the rising edge of a clock pulse.

EB-REG: Register that stores the status signals between I-BUS and E-BUS.

E-BUS: External bus system outside a unit.

E-BUS MASTER: Unit that controls the E-BUS. Active.

E-BUS SLAVE: Unit controlled by the E-BUS MASTER. Passive.

E-GATE: Gate which is controlled by the internal state machine of the unit or by the E-BUS MASTER and switches data to the E-BUS.

E-GATE-REG: Register into which data transmitted to the E-BUS over the E-GATE is entered.

E-READ: Flag in the EB-REG indicating that the OUTPUT CELLS have been transferred completely to the E-BUS.

E-WRITE: Flag in the EB-REG indicating that the E-BUS has been transferred completely to the INPUT CELLS.

Flag: Status bit in a register, indicating a state.

FPGA: Field programmable gate array. Related art.

Handshake: Signal protocol where a signal A indicates a state and another signal B confirms that it has accepted signal A and responded to it.

INPUT CELL: Unit transmitting data from the E-BUS to an I-BUS.

I-BUSn (also I-BUS): Internal bus system of a unit, which may also consist of bundles of individual lines, where n indicates the number of the bus.

II-BUSn (also II-BUS): Internal bus system of a unit, which may also consist of bundles of individual lines, with n denoting the number of the bus. The bus is driven by an INPUT CELL and goes to logic inputs.

IO-BUSn (also IO-BUS): Internal bus system of a unit, which may also consist of bundles of individual lines, with n denoting the number of the bus. The bus is driven by logic outputs and goes to an OUTPUT CELL. n indicates the number of the bus.

I-GATE: Gate that switches data to the I-BUS.

I-GATE-REG: Register which is controlled by the internal state machine or by E-BUS MASTER and into which data transmitted over the I-GATE to the I-BUS is entered.

I-READ: Flag in the EB-REG indicating that the INPUT CELLs have been completely transferred to the I-BUS.

I-WRITE: Flag in the EB-REG indicating that the I-BUS has been completely transferred to the OUTPUT CELLs.

Edge cell: Cell at the edge of a cell array, often with direct contact with the terminals of a unit.

Configuring: Setting the function and interconnecting a logic unit, a (FPGA) cell (logic cell) or a PAE (see reconfiguring).

Primary logic unit (PLU): Unit for configuring and reconfiguring a PAE or logic cell. Embodied by a microcontroller specifically designed for this purpose.

Latch: Storage element which usually relays a signal transparently during the H level and stores it during the L level. Latches where the function of levels is exactly the opposite are sometimes used in PAEs. An inverter is then connected before the clock pulse of a conventional latch.

Logic cells: Configurable cells used in DFPs, FPGAs, DPGAs, fulfilling simple logical or arithmetic functions, depending on configuration.

MASTER: Flag in EB-REG showing that the E-BUS unit is a MASTER.

MODE PLUREG: Register in which the primary logic unit sets the configuration of an INPUT/OUTPUT CELL.

OUTPUT CELL: Unit that transmits data from an I-BUS to the E-BUS.

PAE: Processing array element: EALU with O-REG, R-REG, R20-MUX, F-PLUREG, M-PLUREG, BM UNIT, SM UNIT, sync UNIT, state-back UNIT and power UNIT.

PLU: Unit for configuring and reconfiguring a PAE or a logic cell. Embodied by a microcontroller specifically designed for this purpose.

REQ-MASTER: Flag in the EB-REG indicating that the unit would like to become E-BUS MASTER.

RS flip-flop: Reset/set flip-flop. Storage element which can be switched by two signals.

SET-REG: Register indicating that data has been written in an I-GATE-REG or E-GATE-REG but not yet read.

STATE-GATE: Gate switching the output of the SET-REG to the E-BUS.

Gate: Switch that relays or blocks a signal. Simple comparison: relay.

Reconfiguring: New configuration of any number of PAEs or logic cells while any remaining number of PAEs or logic cells continue their own function (see configuring).

State machine: Logic which can assume miscellaneous states. The transitions between states depend on various input parameters. These machines are used to control complex functions and belong to the related art.

Naming Conventions:

Unit: -UNIT

Operating mode: -MODE

Multiplexer: -MUX

Negated signal: not–

Register for PLU visible: -PLUREG

Internal register: -REG

Shift registers: -sft

Function Convention:

Shift registers: sft

AND function: &

| A | B | Q |
|---|---|---|
| 0 | 0 | 0 |
| 0 | 1 | 0 |
| 1 | 0 | 0 |
| 1 | 1 | 1 |

OR function: #

| A | B | Q |
|---|---|---|
| 0 | 0 | 0 |
| 0 | 1 | 1 |
| 1 | 0 | 1 |
| 1 | 1 | 1 |

NOT function: !

| A | Q |
|---|---|
| 0 | 1 |
| 1 | 0 |

GATE function: G

| EN | D | Q |
|----|---|---|
| 0 | 0 | — |
| 0 | 1 | — |
| 1 | 0 | 0 |
| 1 | 1 | 1 |

What is claimed is:

1. A bus system, comprising:

a processing unit, the processing unit having a multi-dimensional programmable cell architecture;

a first plurality of individual lines positioned within the processing unit, the first plurality of individual lines being bundled;

at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device; and at least one state machine for controlling the at least one interface unit.

2. The bus system of claim 1, wherein the at least one state machine controls an external bus.

3. A bus system, comprising:

a processing unit, the processing unit having a multi-dimensional programmable cell architecture;

a first plurality of individual lines positioned within the processing unit, the first plurality of individual lines being bundled;

at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device; and an address generator in communication with the processing unit, the address generator generating an address for selecting a unit coupled to the bus system.

4. A bus system, comprising:

a processing unit, the processing unit having a multi-dimensional programmable cell architecture;

a first plurality of individual lines positioned within the processing unit, the first plurality of individual lines being bundled;

at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device; and a second plurality of lines coupled to the at least one interface unit, the second plurality of lines for at least one of reading data and writing data.

5. A bus system, comprising:

a processing unit, the processing unit having a multi-dimensional programmable cell architecture;

a first plurality of individual lines positioned within the processing unit, the first plurality of individual lines being bundled;

at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device; and at least one internal bus system coupled to the at least one interface unit, the at least one internal bus system including a plurality of individual lines, the at least one internal bus system for at least one of reading data and writing data.

6. A bus system, comprising:

a processing unit, the processing unit having a multi-dimensional programmable cell architecture;

a first plurality of individual lines positioned within the processing unit, the first plurality of individual lines being bundled;

at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device; and at least one register coupled to the plurality of lines for managing and controlling the bus system.

7. A bus system, comprising:

a processing unit, the processing unit having a multi-dimensional programmable cell architecture;

a first plurality of individual lines positioned within the processing unit, the first plurality of individual lines being bundled;

at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device;

a bus master unit coupled to the plurality of lines for controlling the bus system; and a plurality of slave units in communication with the bus master unit.

8. A bus system, comprising:

a processing unit, the processing unit having a multi-dimensional programmable cell architecture;

a first plurality of individual lines positioned within the processing unit, the first plurality of individual lines being bundled, the first plurality of individual lines providing communication between the processing unit and at least one of: i) an additional processing unit, ii) a memory device and iii) a peripheral device;

at least one interface unit coupled to the plurality of individual lines, the at least one interface unit combining the plurality of individual lines to form the bus system;

a bus master unit coupled to the plurality of lines and controlling the bus system; and a plurality of slave units in communication with the bus master unit;

wherein control of the bus system is transferred dynamically from the bus master unit to another unit coupled to the bus system.

9. The bus system of claim 8, wherein at least one of the plurality of slave units request control of the bus system.

10. A bus system, comprising:

a processing unit, the processing unit having a multi-dimensional programmable cell architecture;

a first plurality of individual lines positioned within the processing unit, the first plurality of individual lines being bundled;

at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device; and a register in communication with the at least one interface unit, the register indicating whether data is stored in the at least one interface unit.

11. A bus system, comprising:

a processing unit, the processing unit having a multi-dimensional programmable cell architecture;

a first plurality of individual lines positioned within the processing unit, the first plurality of individual lines being bundled, the first plurality of individual lines providing communication between the processing unit and at least one of: i) an additional processing unit, ii) a memory device and iii) a peripheral device; and at least one interface unit coupled to the plurality of individual lines, the at least one interface unit combining the first plurality of individual lines to form the bus system, the at least one interface unit being at least one of integral with the processing unit and formed by a configuration of a plurality of logic cells, each of the plurality of logic cells implementing simple logical functions according to a logic cell configuration.

12. A bus system, comprising:

a processing unit, the processing unit having a multi-dimensional programmable cell architecture;

a first plurality of individual lines positioned within the processing unit, the first plurality of individual lines being bundled, the first plurality of individual lines providing communication between the processing unit and at least one of: i) an additional processing unit, ii) a memory device and iii) a peripheral device; and at least one interface unit coupled to the plurality of individual lines, the at least one interface unit combining the first plurality of individual lines to form the bus system, the at least one interface unit being configured by at least one of a primary logic unit and the processing unit.

13. The bus system of claim 12, wherein the primary logic unit is at least partially integrated with the processing unit.

14. A bus system, comprising:

a processing unit, the processing unit having a multi-dimensional programmable cell architecture;

a first plurality of individual lines positioned within the processing unit, the first plurality of individual lines being bundled;

at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device; and at least one connection to at least one of a data flow processor (DFP), a field programmable gate array (FPGA), and a dynamically programmable gate array (DPGA).

15. A bus system, comprising:

a processing unit, the processing unit having a multi-dimensional programmable cell architecture, the processing unit including a plurality of re-programmable, dynamically reconfigurable cells; and a plurality of individual lines positioned within the processing unit, the plurality of individual lines being bundled;

wherein the plurality of individual lines provide communication between the processing unit and at least one of: i) an additional processing unit, ii) a memory device, and iii) a peripheral device.

16. The bus system according to claim 15, wherein the memory device is external to the processing unit.

17. A bus system, comprising:

a processing unit, the processing unit having a multi-dimensional programmable cell architecture, the processing unit including a plurality of re-programmable, dynamically reconfigurable cells;

a first plurality of individual lines positioned within the processing unit, the first plurality of individual lines being bundled; and at least one interface unit coupled to the plurality of individual lines, the at least one interface unit combining the first plurality of individual lines to form the bus system, the first plurality of individual lines providing communication, via the at least one interface unit, between the processing unit and at least one of: i) an additional processing unit, ii) a memory device, and iii) a peripheral device.

18. The bus system according to claim 17, wherein the memory device is external to the processing unit.

19. A bus system, comprising:

a processing unit, the processing unit having a multi-dimensional programmable cell architecture;

a bus positioned within the processing unit;

at least one interface unit coupled to the bus, the bus providing communication, via the at least one interface unit, between the processing unit and at least one of: i) an additional processing unit, ii) a memory device, and iii) a peripheral device; and at least one state machine for controlling the at least one interface unit.

20. The bus system of claim 19, wherein the at least one state machine controls an external bus.

21. A bus system, comprising:

a processing unit, the processing unit having a multi-dimensional programmable cell architecture;

a bus positioned within the processing unit;

at least one interface unit coupled to the bus, the bus providing communication, via the at least one interface unit, between the processing unit and at least one of: i) an additional processing unit, ii) a memory device, and iii) a peripheral device; and an address generator in communication with the processing unit, the address generator generating an address for selecting a unit coupled to the bus.

22. A bus system, comprising:

a processing unit, the processing unit having a multi-dimensional programmable cell architecture;

a first bus positioned within the processing unit;

at least one interface unit coupled to the first bus, the first bus providing communication, via the at least one interface unit, between the processing unit and at least one of: i) an additional processing unit, ii) a memory device, and iii) a peripheral device; and a second bus coupled to the at least one interface unit, the second bus for at least one of reading data and writing data.

23. A bus system, comprising:

a processing unit, the processing unit having a multi-dimensional programmable cell architecture;

a first bus positioned within the processing unit;

at least one interface unit coupled to the first bus, the first bus providing communication, via the at least one interface unit, between the processing unit and at least one of: i) an additional processing unit, ii) a memory device, and iii) a peripheral device; and at least one internal bus system coupled to the at least one interface unit, the at least one internal bus system for at least one of reading data and writing data.

24. A bus system, comprising:

a processing unit, the processing unit having a multi-dimensional programmable cell architecture;

a first bus positioned within the processing unit;

at least one interface unit coupled to the bus, the first bus providing communication, via the at least one interface unit, between the processing unit and at least one of: i) an additional processing unit, ii) a memory device, and iii) a peripheral device; and at least one register coupled to the first bus for managing and controlling the bus system.

25. A bus system, comprising:

a processing unit, the processing unit having a multi-dimensional programmable cell architecture;

a first bus positioned within the processing unit;

at least one interface unit coupled to the first bus, the first bus providing communication, via the at least one interface unit, between the processing unit and at least one of: i) an additional processing unit, ii) a memory device, and iii) a peripheral device; and a bus master unit coupled to the first bus for controlling the bus system; and a plurality of slave units in communication with the bus master unit.

26. A bus system, comprising:

a processing unit, the processing unit having a multi-dimensional programmable cell architecture;

a first bus positioned within the processing unit, the first bus providing communication between the processing unit and at least one of: i) an additional processing unit, ii) a memory device and iii) a peripheral device;

at least one interface unit coupled to the first bus;

a bus master unit coupled to the first bus and controlling the bus system; and a plurality of slave units in communication with the bus master unit;

wherein control of the bus system is transferred dynamically from the bus master unit to another unit coupled to the bus system.

27. The bus system of claim 26, wherein at least one of the plurality of slave units request control of the bus system.

28. A bus system, comprising:

a processing unit, the processing unit having a multi-dimensional programmable cell architecture;

a first bus positioned within the processing unit, the first plurality of individual lines being bundled;

at least one interface unit coupled to the first bus, first bus providing communication, via the at least one interface unit, between the processing unit and at least one of: i) an additional processing unit, ii) a memory device, and iii) a peripheral device; and a register in communication with the at least one interface unit, the register indicating whether data is stored in the at least one interface unit.

29. A bus system, comprising:

a processing unit, the processing unit having a multi-dimensional programmable cell architecture;

a first bus positioned within the processing unit, the first bus providing communication between the processing unit and at least one of: i) an additional processing unit, ii) a memory device and iii) a peripheral device; and at least one interface unit coupled to the first bus, the at least one interface unit being at least one of integral with the processing unit and formed by a configuration of a plurality of logic cells, each of the plurality of logic cells implementing simple logical functions according to a logic cell configuration.

30. A bus system, comprising:

a processing unit, the processing unit having a multi-dimensional programmable cell architecture;

a first bus positioned within the processing unit, the first bus providing communication between the processing unit and at least one of: i) an additional processing unit, ii) a memory device and iii) a peripheral device; and at least one interface unit coupled to the first bus, the at least one interface unit being configured by at least one of a primary logic unit and the processing unit.

31. The bus system of claim 30, wherein the primary logic unit is at least partially integrated with the processing unit.

32. A bus system, comprising:

a processing unit, the processing unit having a multi-dimensional programmable cell architecture;

a first bus positioned within the processing unit;

at least one interface unit coupled to the first bus, the first bus providing communication, via the at least one interface unit, between the processing unit and at least one of: i) an additional processing unit, ii) a memory device, and iii) a peripheral device; and at least one connection to at least one of a data flow processor (DFP), a field programmable gate array (FPGA), and a dynamically programmable gate array (DPGA).

33. A bus system, comprising:

a processing unit, the processing unit having a multi-dimensional programmable cell architecture, the processing unit including a plurality of re-programmable, dynamically reconfigurable cells; and a bus positioned within the processing unit;

wherein the bus provides communication between the processing unit and at least one of: i) an additional processing unit, ii) a memory device, and iii) a peripheral device.

34. The bus system according to claim 33, wherein the memory device is external to the processing unit.

35. A bus system, comprising:

a processing unit, the processing unit having a multi-dimensional programmable cell architecture, the processing unit including a plurality of re-programmable, dynamically reconfigurable cells;

a first bus positioned within the processing unit; and at least one interface unit coupled to the first bus, the first bus providing communication, via the at least one interface unit, between the processing unit and at least one of: i) an additional processing unit, ii) a memory device, and iii) a peripheral device.

* * * * *

(12) EX PARTE REEXAMINATION CERTIFICATE (8705th)
United States Patent
Vorbach et al.

(10) Number: US 6,119,181 C1
(45) Certificate Issued: Nov. 29, 2011

(54) I/O AND MEMORY BUS SYSTEM FOR DFPS AND UNITS WITH TWO- OR MULTI-DIMENSIONAL PROGRAMMABLE CELL ARCHITECTURES

(75) Inventors: Martin Vorbach, Karlsruhe (DE); Robert Münch, Karlsruhe (DE)

(73) Assignee: Pact XPP Technologies AG, Munich (DE)

Reexamination Request:
No. 90/010,450, Mar. 27, 2009

Reexamination Certificate for:
Patent No.: 6,119,181
Issued: Sep. 12, 2000
Appl. No.: 08/947,254
Filed: Oct. 8, 1997

(30) Foreign Application Priority Data

Dec. 20, 1996 (DE) .......................................... 196 54 595

(51) Int. Cl.
*G11C 7/10* (2006.01)
*G06F 15/76* (2006.01)
*G06F 15/78* (2006.01)

(52) U.S. Cl. ........................... 710/100; 710/110; 712/11
(58) Field of Classification Search .................. 710/100
See application file for complete search history.

(56) References Cited

To view the complete listing of prior art documents cited during the proceeding for Reexamination Control Number 90/010,450, please refer to the USPTO's public Patent Application Information Retrieval (PAIR) system under the Display References tab.

*Primary Examiner* — B. James Peikari

(57) ABSTRACT

A uniform bus system is provided which operates without any special consideration by a programmer. Memories and peripheral may be connected to this bus system without any special measures. Likewise, units may be cascaded with the help of the bus system. The bus system combines a number of internal lines, and leads them as a bundle to terminals. The bus system control is predefined and does not require any influence by the programmer. Any number of memories, peripherals or other units can be connected to the bus system.

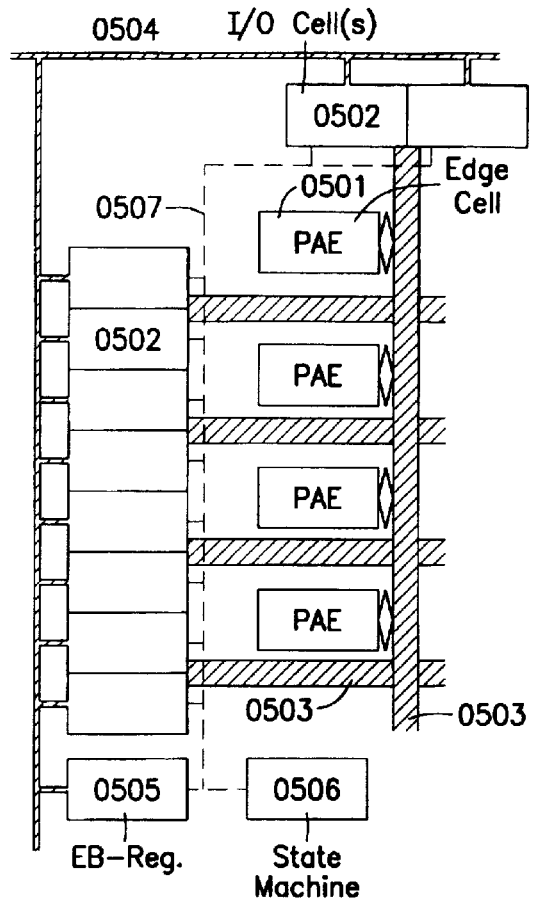

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-9, 11-14, 17, 18, 30 and 31 is confirmed.

Claims 10, 15, 19, 21-26, 28, 29, 32, 33 and 35 are determined to be patentable as amended.

Claims 16, 20, 27 and 34, dependent on an amended claim, are determined to be patentable.

New claims 36-48 are added and determined to be patentable.

10. A bus system, comprising:
a processing unit, the processing unit having a multi-dimensional programmable cell architecture;
a [first] plurality of individual lines positioned within the processing unit[, the first plurality of individual lines being bundled];
at least one interface unit coupled to the [first] plurality of individual lines, the at least one interface unit combining the first plurality of individual lines to [form] *lead the lines as a bundle defined by at least one bus function assigned to the lines by the at least one interface unit, thereby forming the* bus system, the [first] plurality of individual lines providing communication, via the at least one interface unit, between the processing unit and at least one of: i) an additional processing unit, ii) a memory device, and iii) a peripheral device; and
a register in communication with the at least one interface unit, the register indicating whether data is stored in the at least one interface unit.

15. A bus system, comprising:
a processing unit, the processing unit having a multi-dimensional programmable cell architecture, the processing unit including a plurality of re-programmable, dynamically reconfigurable cells; [and]
a plurality of individual lines, *their being individual in that no bus function is assigned to any of the lines, the plurality of individual lines being* positioned within the processing unit, *and* the plurality of individual lines being bundled; *and*
*an interface unit coupled to the plurality of lines, the interface unit combining the plurality of lines to form a bus;*
wherein the plurality of individual lines provide communication, *via the interface unit,* between the processing unit and at least one of: i) an additional processing unit, ii) a memory device, and iii) a peripheral device.

19. A bus system, comprising:
a processing unit, the processing unit having a multi-dimensional programmable cell architecture;
*lines for* a bus positioned within the processing unit;
at least one interface unit coupled to the *lines for the* bus; *and*
*at least one state machine for controlling the at least one interface unit; wherein:*
[,] the *lines for the* bus [providing] *provide* communication, via the at least one interface unit, between the processing unit and at least one of: i) an additional processing unit, ii) a memory device, and iii) a peripheral device; and
[at least one state machine for controlling] the at least one interface unit *combines the lines to assign to the lines a bus function.*

21. A bus system comprising:
a processing unit, the processing unit having a multi-dimensional programmable cell architecture;
*lines for* a bus positioned within the processing unit;
at least one interface unit coupled to the *lines for the* bus; *and*
*an address generator in communication with the processing unit, the address generator generating an address for selecting a unit coupled to the bus;*
wherein:
the *lines for the* bus [providing] *provide* communication, via the at least one interface unit, between the processing unit and at least one of: i) an additional processing unit, ii) a memory device, and iii) a peripheral device; and
[an address generator in communication with] the [processing unit, the address generator generating an address for selecting a] *at least one interface* unit [coupled] *combines the lines* to [the bus] *assign to the lines a bus function.*

22. A bus system, comprising:
a *reconfigurable* processing unit, the *reconfigurable* processing unit having a multi-dimensional programmable cell architecture;
*lines for* a first bus positioned within the *reconfigurable* processing unit;
at least one interface unit *fixedly defining a bus function and* coupled to the *lines for the* first bus; *and*
a second bus coupled to the at least one interface unit, the second bus for at least one of reading data and writing data;
wherein:
the *lines for the* first bus [providing] *provide* communication, via the at least one interface unit, beteen the *reconfigurable* processing unit and at least one of: i) an additional processing unit, ii) a memory device, and iii) a peripheral device;
*the lines are dynamically coupled to the at least one interface unit;* and
[a second bus coupled to] the at least one interface unit [, the second bus for at least one of] *combines the lines that are dynamically coupled to the at least one interface unit to form a logical collection of lines, the logical collection being defined by assignment, by the at least one interface unit* [reading data] and [writing data] *to the dynamically coupled lines, of the fixedly defined bus function.*

23. A bus system, comprising:

a *reconfigurable* processing unit, the *reconfigurable* processing unit having a multi-dimensional programmable cell architecture,

*lines for* a first bus positioned within the *reconfigurable* processing unit;

at least one interface unit *fixedly defining a bus function and* coupled to the *lines for the* first bus; *and* at least one internal bus system coupled to the at least one interface unit, the at least one internal bus system for at least one of reading and writing data;

wherein:

the *lines for the* first bus [providing] *provide* communication, via the at least one interface unit, between the *reconfigurable* processing unit and at least one of: i) an additional processing unit, ii) a memory device, and iii) a peripheral device;

*the lines are dynamically coupled to the at least one interface unit;* and

*the* at least one [internal bus system coupled to the at least one] interface unit [, the at least one internal bus] *combines the lines that are dynamically coupled to the* [system for] *at least one interface unit to form a logical collection of lines, the logical collection being defined by assignment, by the at least one interface unit* [reading data] and [writing data] *to the dynamically coupled lines, of the fixedly defined bus function.*

24. A bus system comprising:

a processing unit, the processing unit having a multi-dimensional programmable cell architecture;

*lines for* a [first] bus positioned within the processing unit;

at least one interface unit coupled to the *lines for the* bus; and at least one register coupled to the lines for managing and controlling the bus system; wherein;

[,] the [first] *lines for the* bus [providing] *provide* communication, via the at least one interface unit, between the processing unit and at least one of: i) an additional processing unit, ii) a memory device, and iii) a peripheral device; and

[at least one register coupled to] the [first bus for managing and controlling the] *at least one interface unit combines the lines to assign to the lines a* bus [system] *function*.

25. A bus system comprising:

a *reconfigurable* processing unit, the *reconfigurable* processing unit having a multi-dimensional programmable cell architecture;

*lines for* a [first] bus positioned within the *reconfigurable* processing unit;

at least one interface unit *fixedly defining a bus function* and coupled to the [first] *line for the* bus;

a bus master unit coupled to the lines for controlling the bus system; and a plurality of slave units in communication with the bus master unit;

wherein:

[,] the [first] *lines for the* bus [providing] *provide* communication, via the at least one interface unit, between the *reconfigurable* processing unit and at least one of: i) an additional processing unit, ii) a memory device, and iii) a peripheral device;

*the lines are dynamically coupled to the at least one interface unit;* and

[a bus master unit coupled to] the [first bus for controlling] *at least one interface unit combines the lines that are dynamically coupled to* the [bus system; and] *at least one interface to form* a [plurality] *logical collection of* [slave units in communication with] *lines,* the [bus master] *logical collection being defined by assignment, by the at least one interface* unit *and to the dynamically coupled lines, of the fixedly defined bus function.*

26. A bus system, comprisng:

a *reconfigurable* processing unit, the *reconfigurable* processing unit having a multi-dimensional programmable cell architecture;

*lines for* a [first] bus positioned within the *reconfigurable* processing unit, the [first bus] *lines* providing communication between the *reconfigurable* processing unit and at least one of: i) an additonal processing unit, ii) a memory device, and iii) a peripheral device;

at least one interface unit *fixedly defining a bus function;* a bus master unit coupled to the [first] *lines for the* bus and controlling the bus system; and a plurality of slave units in communication with the bus master unit; wherein:

control of the bus system is transferred dynamically from the bus master unit to another unit coupled to the bus system;

*the lines are dynamically coupleable to the at least one interface unit;* and

*the at least one interface unit combines the lines that are dynamically coupled to the at least one interface unit to form a logical collection of lines, the logical collection being defined by assignment, by the at least one interface unit and to the dynamically coupled lines, of the fixedly defined bus function.*

28. A bus system, comprising:

a processing unit, the processing unit having a multi-dimensional programmable cell architecture;

a [first bus] *plurality of individual lines* positioned within the processing unit[, the first plurality of individual lines being bundled];

at least one interface unit coupled to *and bundling* the [first bus] *plurality of individual lines to form a bus,* [first bus] *the plurality of individual lines* providing communication, via the at least one interface unit, between the processing unit and at least one of: i) an additional processing unit, ii) a memory device, and iii) a peripheral device; and a register in communication with the at least one interface unit, the register indicating whether data is stored in the at least one interface unit.

29. A bus system comprising:

a *reconfigurable* processing unit, the *reconfigurable* processing unit having a multi-dimensional programmable cell architecture;

*lines for* a [first] bus positioned within the *reconfigurable* processing unit, the [first bus] *lines* providing communication between the *reconfigurable* processing unit at at least one of: i) an additional processing unit, ii) a memory device, and iii) a peripheral device; and at least one interface unit *defining a bus function and* coupled to [first] *the lines for the* bus[,];

wherein:

*the lines are dynamically coupled to the at least one interface unit;* the at least one interface unit [being] *is at least one of* integral with the *reconfigurable* processing unit and formed by a configuration of a plurality of logic cells, each of the plurality of logic cells implementing simple logical functions according to a logic cell configuration; *and* the at least one interface unit combines the lines that are dynamically coupled to the at least one interface unit to form a logical collection of lines, the logical collection being defined by assignment, by the at least one interface unit and to the dynamically coupled lines, of the defined bus function.

32. A bus system comprising:

a *reconfigurable* processing unit, the *reconfigurable* processing unit having a multi-dimensional programmable cell architecture;

*lines for* a [first] bus positioned within the *reconfigurable* processing unit;

at least one interface unit *fixedly defining a bus function and* coupled to the [first] *lines for the* bus; *and*

*at least one connection to the at least one of a data flow processor (DFP), a field programmable gate array (FPGA), and a dynamically programmble gate array (DPGA);* wherein:

the [first] *the lines for the* bus [providing] *provide* communication, via the at least one interface unit, between the *reconfigurable* processing unit and at least one of: i) an additional processing unit, ii) a memory device, and iii) a peripheral device;

the lines are dynamically coupleable to the at least one interface unit; and

*the* at least one [connection to the at least one of a data flow processor (DFP),] interface unit combines the lines that are dynamically coupled to the at least one interface unit to form a [field programmable gate array (FPGA)] *logical collection of lines, the logical collection being defined by assignment, by the at least one interface unit* and [a dynamically programmable gate array (DPGA)] *to the dynamically coupled lines, of the fixedly defined bus function.*

33. A bus system comprising:

*an interface unit fixedly defining a bus function;* a *reconfigurable* processing unit, the *reconfigurable* processing unit having a multi-dimensional programmable cell architecture, *and* the *reconfigurable* processing unit including a plurality of re-programmable, dynamically reconfigurable cells; and a *plurality of lines to which the* bus *function is not assigned and that are* positioned within the *reconfigurable* processing unit;

wherein:

*the plurality of lines are dynamically coupled to the interface unit, the interface unit thereby combining the plurality of lines such that the plurality of lines thereby form a bus to which the bus function is assigned; and* the *plurality of lines and the formed* bus provide communication between the *reconfigurable* processing unit and *the* at least one of i) an additional processing unit, ii) a memory device, and iii) a peripheral device.

35. A bus system comprising:

a *reconfigurable* processing unit, the *reconfigurable* processing unit having a multi-dimensional programmable cell architecture, the *reconfigurable* processing unit including a plurality of re-programmable, dynamically reconfigurable cells;

*lines for* a [first] bus positioned within the *reconfigurable* processing unit; and at least one interface unit *fixedly defining a bus function and* coupled to the [first] *lines for the* bus[.];

wherein:

the [first] *lines for the* bus [providing] *provide* communication, via the at least one interface unit, between the *reconfigurable* processing unit and at least one of: i) an additional processing unit, ii) a memory device, and iii) a peripheral device;

the lines are dynamically coupleable to the at least one interface unit; and the at least one interface unit combines the lines that are dynamically coupled to the at least one interface unit to form a logical collection of lines, the logical collection being defined by assignment by the at least one interface unit and to the dynamically coupled lines, of the fixedly defined bus function.

36. *The bus system of claim 19, wherein:*

*the at least one interface unit fixedly defines the bus function;*

*the lines are dynamically coupleable to the at least one interface unit, the dynamic coupling producing the combination of the lines, the combination defining a logical collection of lines by the assignment of the fixedly defined bus function to the dynamically coupled lines.*

37. *The bus system of claim 21, wherein:*

*the at least one interface unit fixedly defines the bus function;*

*the lines are dynamically coupleable to the at least one interface unit, the dynamic coupling producing the combination of the lines, the combination defining a logical collection of lines by the assignment of the fixedly defined bus function to the dynamically coupled lines.*

38. *The bus system of claim 24, wherein:*

*the at least one interface unit fixedly defines the bus function;*

*the lines are dynamically coupleable to the at least one interface unit, the dynamic coupling producing the combination of the lines, the combination defining a logical collection of lines by the assignment of the fixedly defined bus function to the dynamically coupled lines.*

39. *A system, comprising:*

*a reconfigurable processing unit, the reconfigurable processing unit having a multi-dimensional programmable cell architecture and including a plurality of re-programmable, dynamically reconfigurable cells;*

*a plurality of lines to which no bus function is assigned and that are positioned within the reconfigurable processing unit; and*

*an interface unit fixedly defining at least one bus function and interfacing between the reconfigurable processing unit and at least one of: i) an additional processing unit, ii) a memory device, and iii) a peripheral device;*

*wherein:*

*the plurality of lines are dynamically coupled to the interface unit, the interface unit thereby combining the plurality of lines, such that the plurality of lines form at least one bus to which the at least one bus function is assigned;*

*the plurality of lines and the formed at least one bus provide communication, via the interface unit, between the reconfigurable processing unit and the at least one of: i) the additional processing unit, ii) the memory device, and iii) the peripheral device.*

40. A system, comprising:
an interface unit fixedly defining a bus function;
a reconfigurable processing unit, the reconfigurable processing unit having a multi-dimensional programmable cell architecture and including a plurality of re-programmable, dynamically reconfigurable cells; and
a plurality of lines to which the bus function is not assigned and that are positioned within the reconfigurable processing unit;
wherein:
   the plurality of lines are dynamically coupled to the interface unit, the interface unit thereby combining the plurality of lines such that the plurality of lines thereby form a bus to which the bus function is assigned;
   the interface unit interfacing between the reconfigurable processing unit and at least one of: i) an additional processing unit, ii) a memory device, and iii) a peripheral device; and
   the plurality of lines and the formed bus provide communication, via the interface unit, between the reconfigurable processing unit and the at least one of: i) the additional processing unit, ii) the memory device, and iii) the peripheral device.

41. A bus system, comprising:
a processing unit, the processing unit having a multi-dimensional programmable cell architecture;
a plurality of individual lines whose individuality is in that they are unassigned a bus function, the plurality of individual lines being positioned within the processing unit and being bundled;
at least one interface unit coupled to the plurality of individual lines, the at least one interface unit performing the bundling of the plurality of individual lines to form the bus system, the plurality of individual lines providing communication, via the at least one interface unit, between the processing unit and at least one of: i) an additional processing unit, ii) a memory device, and iii) a peripheral device; and
at least one state machine for controlling the at least one interface unit.

42. The bus system of claim 41, wherein the at least one interface unit is permanently implemented.

43. The bus system of claim 42, wherein the bundling includes defining a logical collection of lines by assignment ot the lines of a bus function fixedly defined by the at least one interface unit.

44. The bus system of claim 43, wherein the plurality of lines are dynamically coupled to the at least one interface unit.

45. A bus system, comprising:
a processing unit, the procesing unit having a multi-dimensional programmable cell architecture;
a plurality of individual lines positioned within the processing unit;
at least one interface unit coupled to the plurality of individual lines, the at least one interface unit combining the plurality of lines to lead them as a bundle, thereby forming the bus system, the plurality of individual lines providing communication, via the at least one interface unit, between the processing unit and at least one of: i) an additional processing unit, ii) a memory device, and iii) a peripheral device; and
an address generator in communication with the processing unit, the address generator generating an address for selecting a unit coupled to the bus system.

46. A bus system, comprising:
a reconfigurable processing unit, the reconfigurable processing unit having a multi-dimensional programmable cell architecture;
lines for a bus positioned within the reconfigurable processing unit;
at least one interface unit fixedly defining a bus function and coupled to the line for the bus; and
at least one state machine for controlling the at least one interface unit;
wherein:
   the lines for the bus provide comunication, via the at least one interface unit, between the reconfigurable processing unit and at least one of: i) an additional processing unit, ii) a memory device, and iii) a peripheral device;
   the lines are dynamically coupled to the at least one interface unit; and
   the at least one interface unit combines the lines that are dynamically coupled to the at least one interface unit to form a logical collecton of lines, the logical collection being defined by assignment, by the at least one interface unit and to the dynamically coupled lines, of the fixedly defined bus function.

47. A bus system, comprising:
a reconfigurable processing unit, the reconfigurable processing unit having a multi-dimensional programmable cell architecture;
lines for a bus positioned within the reconfigurable processing unit;
at least one interface unit fixedly defining a bus function and coupled to the line for the bus; and
an address generator in communication with the reconfigurable processing unit, the address generator generating an address for selecting a unit coupled to a bus;
wherein:
   the lines for the bus provide communication, via the at least one interface unit, between the reconfigurable processing unit and at least one of: i) an additional processing unit, ii) a memory device, and iii) a peripheral device;
   the lines are dynamically coupled to the at least one interface unit; and
   the at least one interface unit combines the lines that are dynamically coupled to the at least one interface unit to form a logical collection of lines, the logical collection being defined by assignment, by the at least one interface unit and to the dynamically coupled lines, of the fixedly defined bus function.

48. A bus system, comprising:
a reconfigurable processing unit, the reconfigurable processing unit having a multi-dimensional programmable cell architecture;
lines for a bus positioned within the reconfigurable processing unit;
at least one interface unit fixedly defining a bus function and coupled to the line for the bus; and
at least one register coupled to the lines for managing and controlling the bus system; and
wherein:
   the lines for the bus provide communication, via the at least one interface unit, between the reconfigurable processing unit and at least one of: i) an additional processing unit, ii) a memory device, and iii) a peripheral device;

*the lines are dynamically coupled to the at least one interface unit; and*

*the at least one interface unit combines the lines that are dynamically coupled to the at least one interface unit to form a logical collection of lines the logical collection being defined by assignment, by the at least one interface unit and to the dynamically coupled lines, of the fixedly defined bus function.*

\* \* \* \* \*